(12) United States Patent
Ramkumar

(10) Patent No.: US 9,876,020 B1
(45) Date of Patent: Jan. 23, 2018

(54) INTEGRATION OF A MEMORY TRANSISTOR INTO HIGH-K, METAL GATE CMOS PROCESS FLOW

(71) Applicant: Cypress Semiconductor Corporation, San Jose, CA (US)

(72) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/516,794

(22) Filed: Oct. 17, 2014

Related U.S. Application Data

(63) Continuation of application No. 14/229,594, filed on Mar. 28, 2014, now Pat. No. 8,883,624.
(Continued)

(51) Int. Cl.
*H01L 27/088* (2006.01)
*H01L 29/792* (2006.01)
(Continued)

(52) U.S. Cl.
CPC .. *H01L 27/11568* (2013.01); *H01L 27/11573* (2013.01); *H01L 29/4916* (2013.01);
(Continued)

(58) Field of Classification Search
CPC ............. H01L 27/11521; H01L 29/792; H01L 29/42348; H01L 29/7883; H01L 27/088;
(Continued)

(56) References Cited

U.S. PATENT DOCUMENTS 5,801,983 A * 9/1998 Saeki ................... G11C 11/4097
365/149
5,973,373 A * 10/1999 Krautschneider . H01L 27/11273
257/330
(Continued)

FOREIGN PATENT DOCUMENTS

WO 2013148112 A1 10/2013
WO 2013148196 A1 10/2013

OTHER PUBLICATIONS

"32/28nm Low-Power High-K Metal Gate Logic", Samsung Semiconductor, Inc., dated Mar. 2011; 2 pages.
(Continued)

*Primary Examiner* — Benjamin Sandvik
*Assistant Examiner* — Gustavo Ramallo

(57) ABSTRACT

Memory cells including embedded SONOS based non-volatile memory (NVM) and MOS transistors are described. The memory cell includes a substrate having a non-volatile memory (NVM) region and a plurality of metal-oxide-semiconductor (MOS) regions. A NVM transistor in the NVM region includes a tunnel dielectric on the substrate, a charge-trapping layer on the tunnel dielectric, and a blocking dielectric comprising a high-k dielectric material over the charge-trapping layer. The plurality of MOS regions include a number of MOS transistors. At least one of the MOS transistors includes a gate dielectric comprising a high-k dielectric material over a surface of the substrate. Generally, the blocking dielectric and the gate dielectric comprise the same high-k dielectric material. Other embodiments are also described.

11 Claims, 20 Drawing Sheets

Related U.S. Application Data

(60) Provisional application No. 61/883,873, filed on Sep. 27, 2013.

(51) Int. Cl.
*H01L 27/11568* (2017.01)
*H01L 29/51* (2006.01)
*H01L 29/49* (2006.01)
*H01L 27/11573* (2017.01)

(52) U.S. Cl.
CPC .......... *H01L 29/513* (2013.01); *H01L 29/518* (2013.01); *H01L 29/792* (2013.01)

(58) Field of Classification Search
CPC ........... H01L 27/1052; H01L 27/11568; H01L 29/66833; H01L 51/0508; G11C 11/223; G11C 11/412
See application file for complete search history.

(56) References Cited

U.S. PATENT DOCUMENTS

| | | | |
|---|---|---|---|
| 6,100,120 A * | 8/2000 | Yu | H01L 21/28211 257/E21.434 |
| 6,479,339 B2 | 11/2002 | Nandakumar et al. | |
| 6,586,808 B1 * | 7/2003 | Xiang | H01L 21/28105 257/333 |
| 6,818,558 B1 * | 11/2004 | Rathor | H01L 27/115 257/E21.679 |
| 7,091,089 B2 | 8/2006 | Steimle | |
| 7,091,130 B1 | 8/2006 | Rao et al. | |
| 7,158,420 B2 * | 1/2007 | Lung | G11C 16/0475 257/324 |
| 7,315,474 B2 | 1/2008 | Lue | |
| 7,429,767 B2 | 9/2008 | Bhattacharyya | |
| 7,787,303 B2 * | 8/2010 | Jenne | G11C 16/0408 365/185.18 |
| 7,811,886 B2 | 10/2010 | Winstead et al. | |
| 8,071,453 B1 * | 12/2011 | Ramkumar | H01L 27/11568 438/197 |
| 8,143,129 B2 | 3/2012 | Ramkumar et al. | |
| 8,153,491 B2 | 4/2012 | Lue et al. | |
| 8,222,111 B1 | 7/2012 | Hwang | |
| 8,330,210 B2 | 12/2012 | Lai et al. | |
| 8,409,950 B1 | 4/2013 | Shea et al. | |
| 8,542,514 B1 * | 9/2013 | Lakshminarayanan | G11C 14/0054 257/324 |
| 8,614,124 B2 | 12/2013 | Jenne et al. | |
| 8,860,122 B1 * | 10/2014 | Polishchuk | H01L 21/28273 257/257 |
| 8,883,624 B1 | 11/2014 | Ramkumar | |
| 2003/0032237 A1 * | 2/2003 | Clevenger | H01L 21/28194 438/243 |
| 2004/0136240 A1 * | 7/2004 | Zheng | H01L 29/7923 365/185.29 |
| 2005/0003614 A1 * | 1/2005 | Min | H01L 27/105 438/257 |
| 2006/0170029 A1 * | 8/2006 | Liu | H01L 21/28273 257/315 |
| 2006/0198190 A1 * | 9/2006 | Lue | G11C 16/0483 365/185.12 |
| 2007/0042546 A1 * | 2/2007 | Thomas | H01L 21/28123 438/257 |
| 2007/0045711 A1 * | 3/2007 | Bhattacharyya | H01L 21/28273 257/315 |
| 2007/0082447 A1 * | 4/2007 | Lu | H01L 21/28202 438/264 |
| 2008/0096395 A1 * | 4/2008 | Terasaki | H01L 21/28202 438/759 |
| 2008/0150008 A1 * | 6/2008 | Kim | H01L 21/28282 257/324 |
| 2008/0290399 A1 * | 11/2008 | Levy | H01L 21/28282 257/324 |
| 2009/0001443 A1 * | 1/2009 | Krishnamohan | H01L 21/28273 257/316 |
| 2009/0039414 A1 * | 2/2009 | Lue | H01L 21/28282 257/324 |
| 2009/0045452 A1 * | 2/2009 | Lue | G11C 16/0466 257/321 |
| 2009/0098737 A1 * | 4/2009 | Doris | H01L 21/28088 438/742 |
| 2009/0181530 A1 | 7/2009 | Lisiansky et al. | |
| 2009/0243001 A1 * | 10/2009 | Ramkumar | H01L 21/3145 257/411 |
| 2010/0264482 A1 * | 10/2010 | Bhattacharyya | H01L 29/792 257/324 |
| 2011/0156121 A1 | 6/2011 | Teo et al. | |
| 2013/0020626 A1 | 1/2013 | Tan et al. | |
| 2013/0069056 A1 * | 3/2013 | Takemura | H01L 29/4236 257/43 |
| 2013/0092991 A1 | 4/2013 | Liao et al. | |
| 2013/0175604 A1 * | 7/2013 | Polishchuk | H01L 29/792 257/325 |
| 2013/0178031 A1 * | 7/2013 | Ramkumar | H01L 21/823412 438/287 |
| 2014/0001575 A1 | 1/2014 | Adams et al. | |
| 2015/0060989 A1 * | 3/2015 | Loiko | H01L 29/49 257/324 |

OTHER PUBLICATIONS

"Implementation of High K/Metal Gates in High Volume Manufacturing," Applied Materials, accessed from http://www.tel.uva.es/descargar.htm?id=6134 ; 5 pages.
International Search Report for International Application No. PCT/US14/54502 dated Oct. 3, 2014; 3 pages.
Jeong-Mo Hwang, "Bringing Non-Volatile Memory Blocks to Socs Using the Sonos Process", Simtek Corporation; 11 pages.
Ramkumar, et al., "Cypress SONOS Technology", Cypress Semiconductor, dated Sep. 10, 2013; 13 pages.
USPTO Notice of Allowance for U.S. Appl. No. 14/229,594 dated Aug. 7, 2014; 8 pages.
USPTO Notice of Allowance for U.S. Appl. No. 14/229,594 dated Sep. 23, 2014; 9 pages.
Written Opinion of the International Searching Authority for International Application No. PCT/US14/54502 dated Oct. 3, 2014; 4 pages.
SIPO Office Action for Chinese Application No. 2014800351735 dated Mar. 27, 2017; 4 pages.
USPTO Non-Final Rejection for Application No. dated Sep. 9, 2016; 21 pages.
USPTO Notice of Allowance for U.S. Appl. No. 15/080,997 dated Dec. 7, 2016; 9 pages.
USPTO Notice of Allowance for U.S. Appl. No. 15/459,230 dated Oct. 10, 2017; 8 pages.

\* cited by examiner

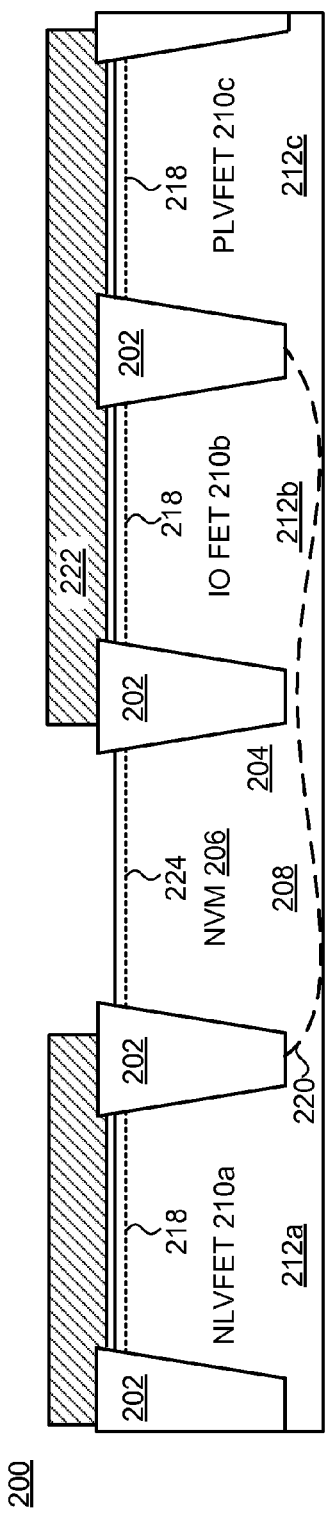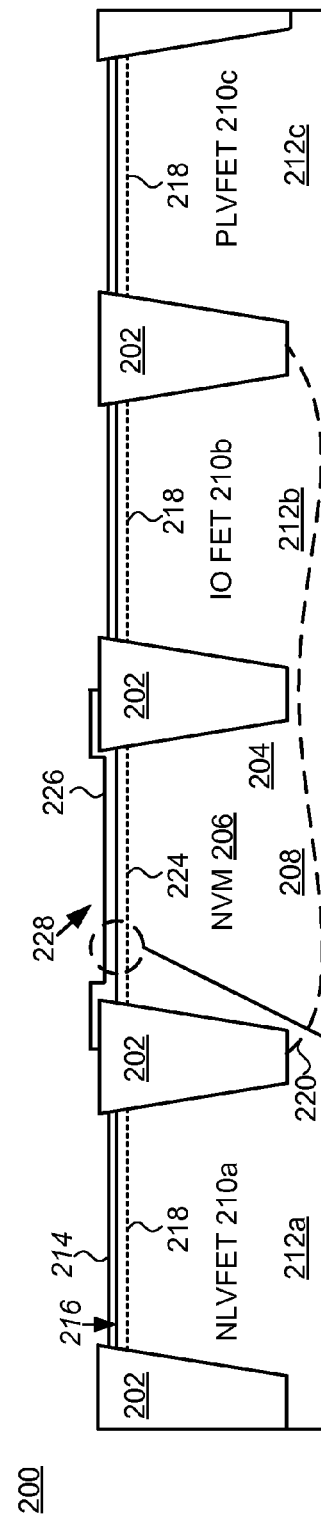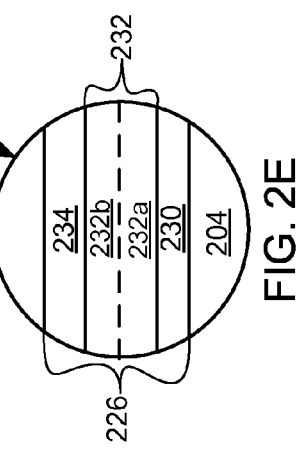

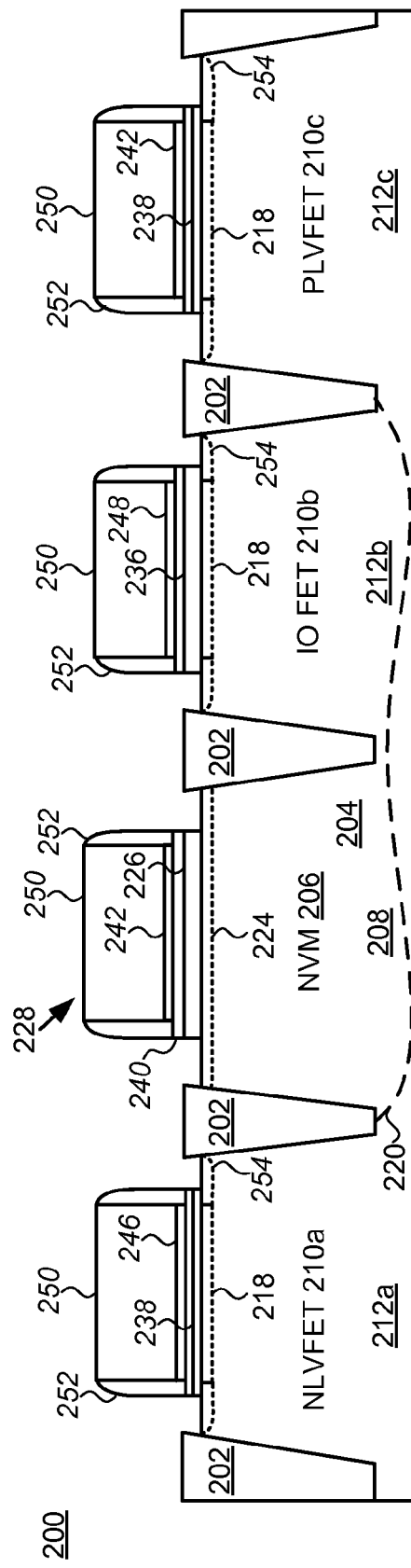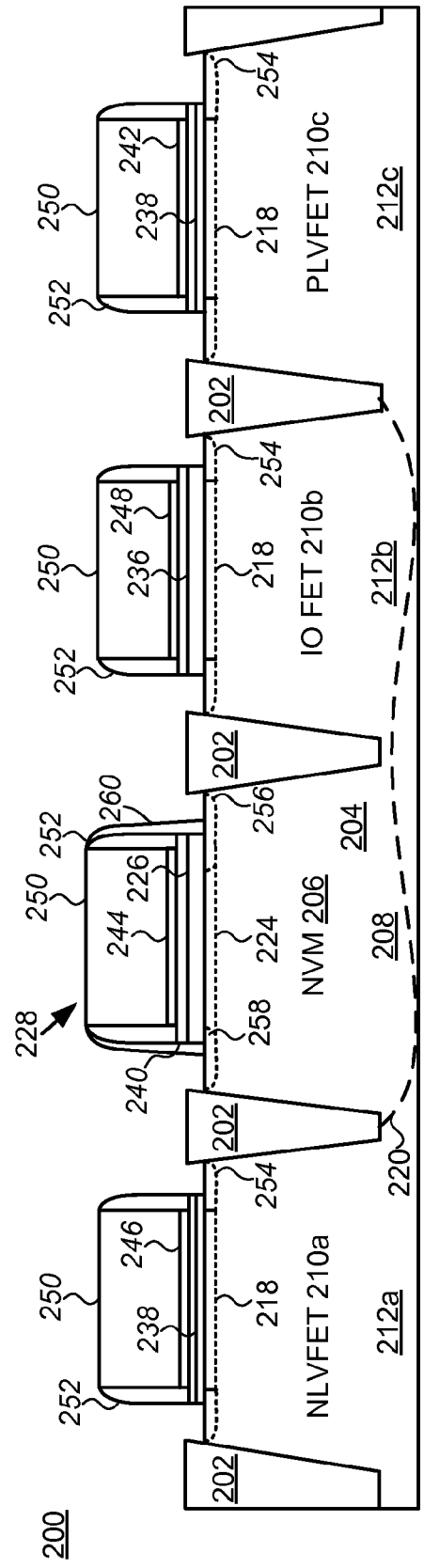

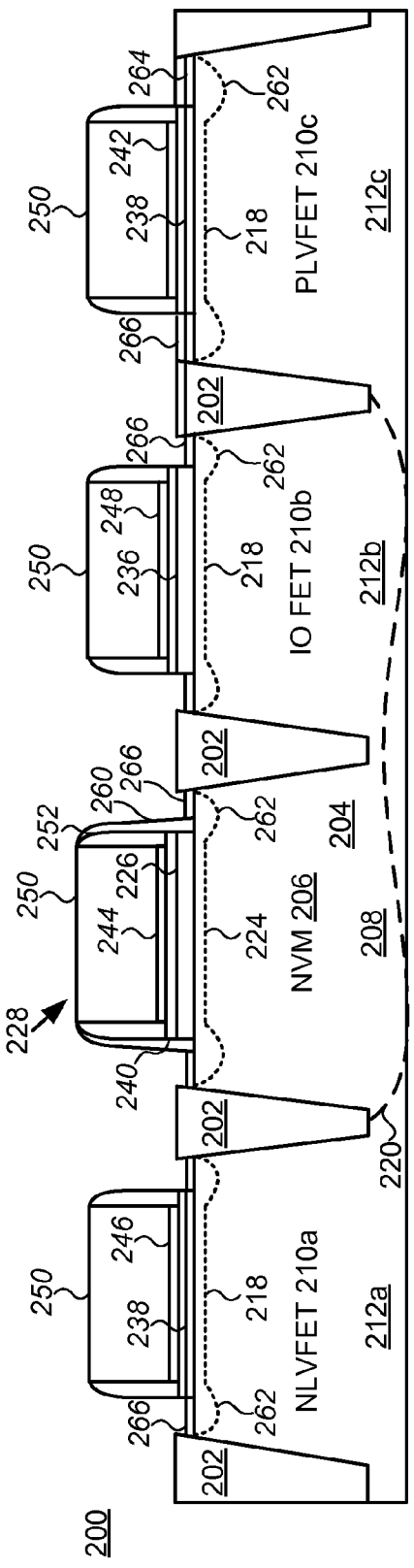
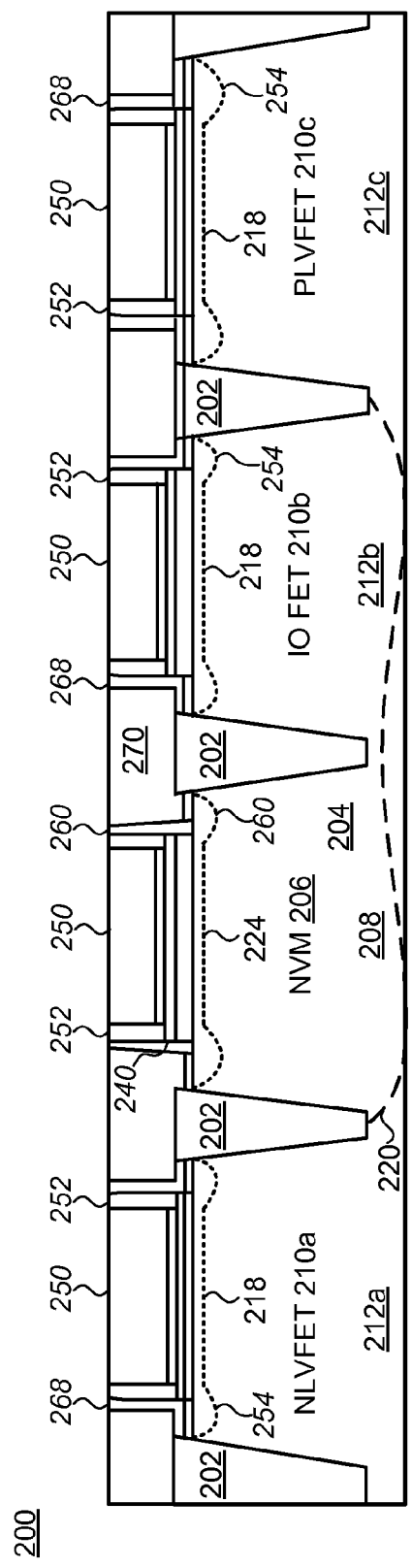

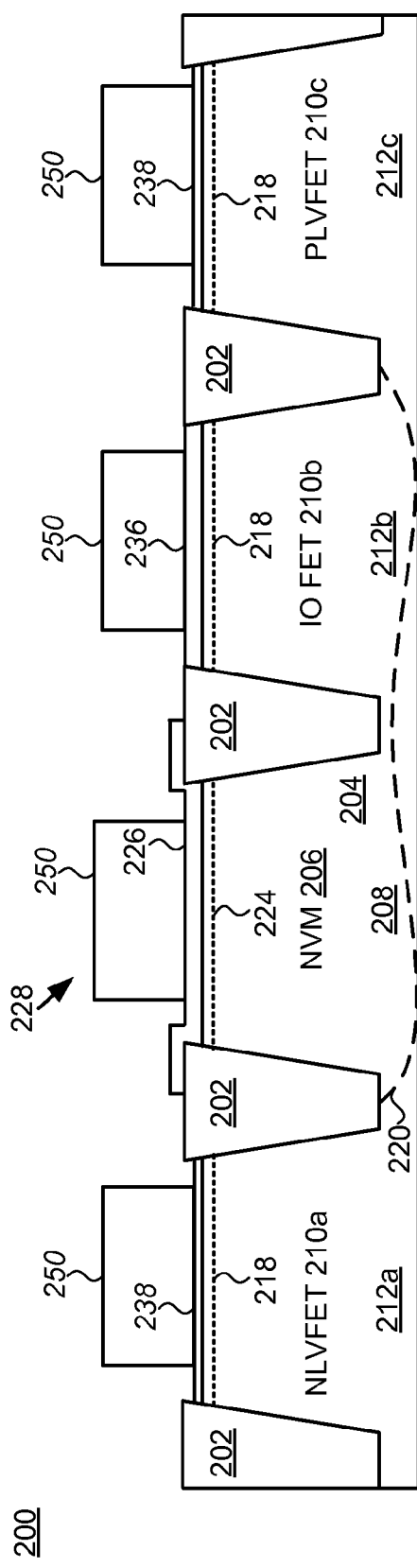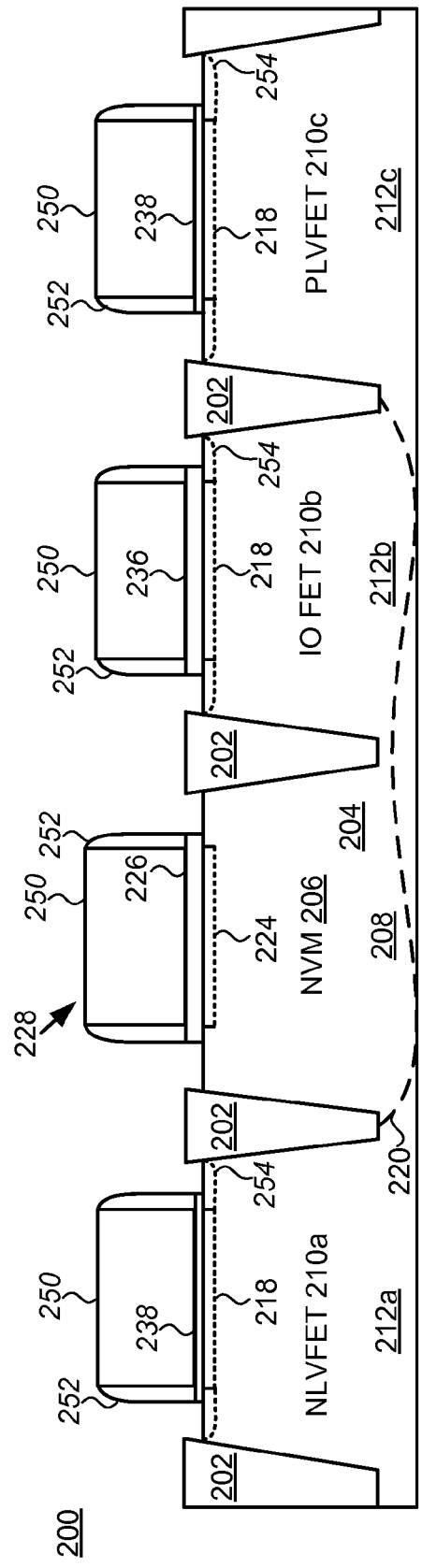

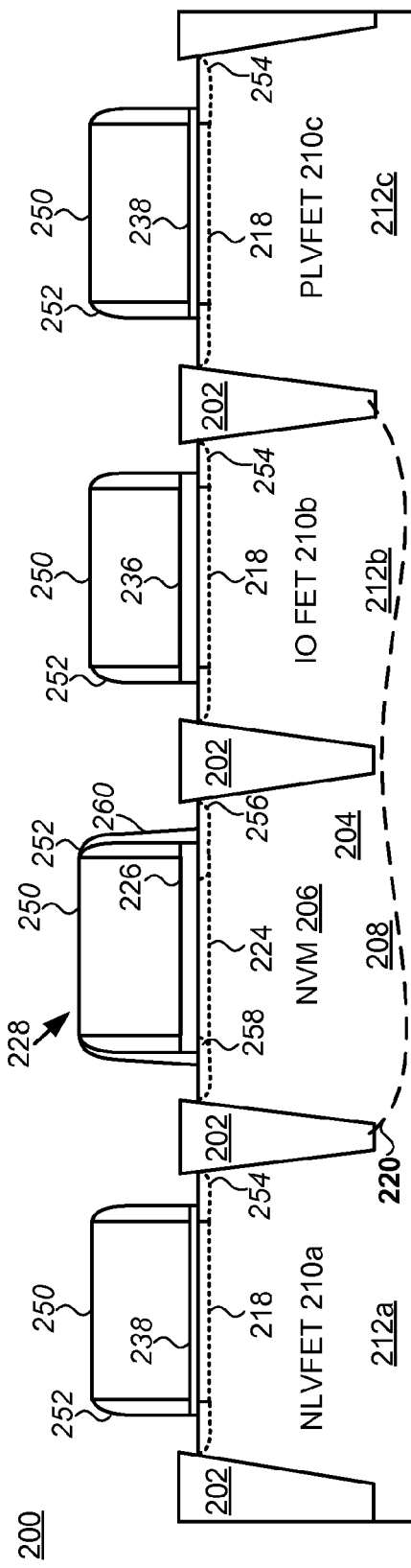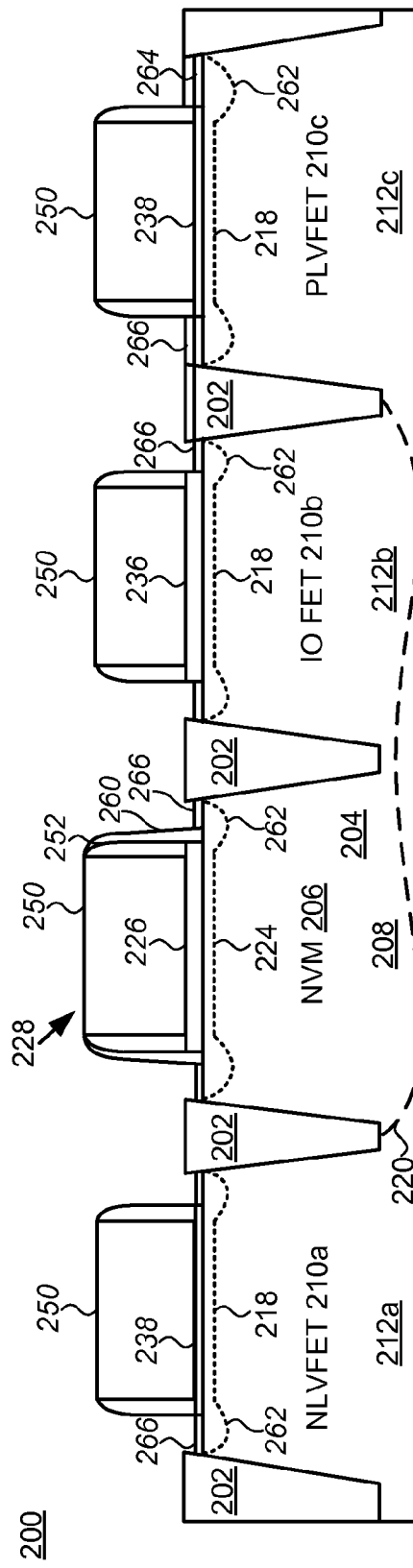

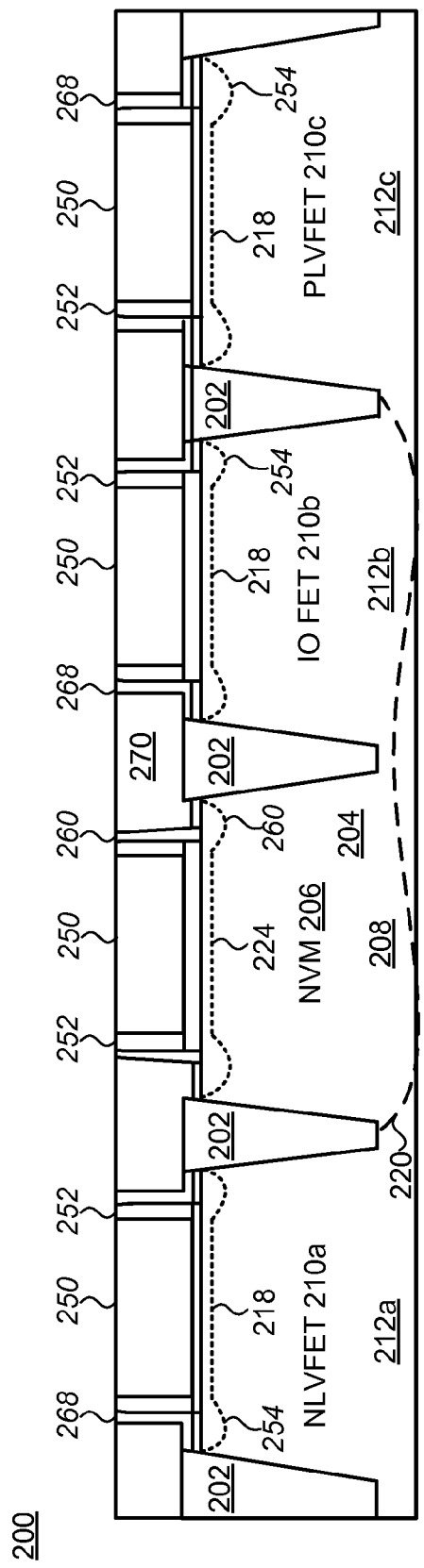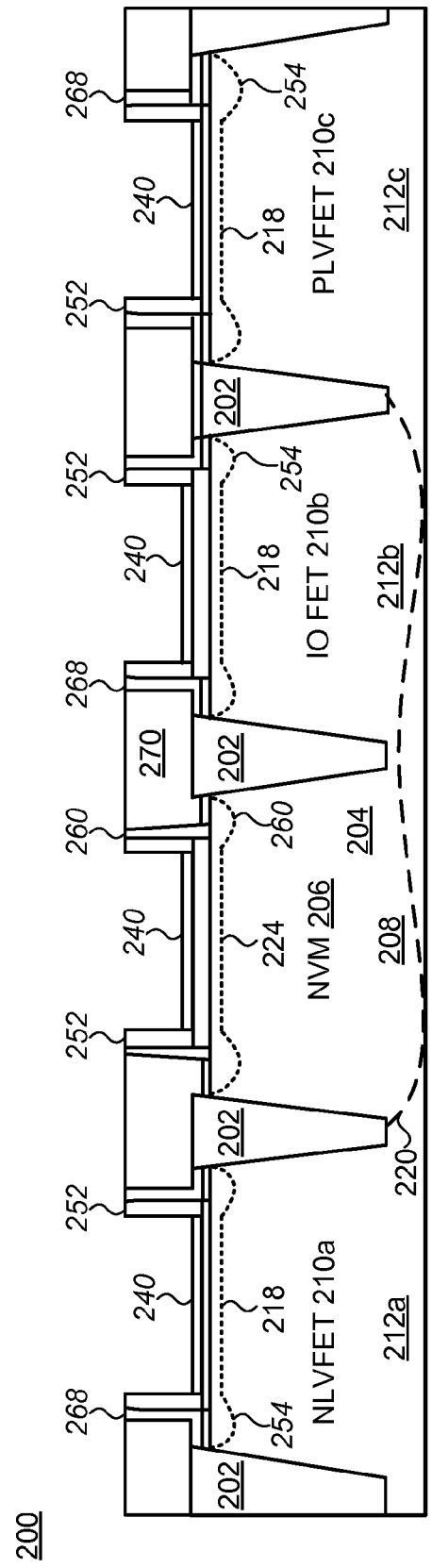

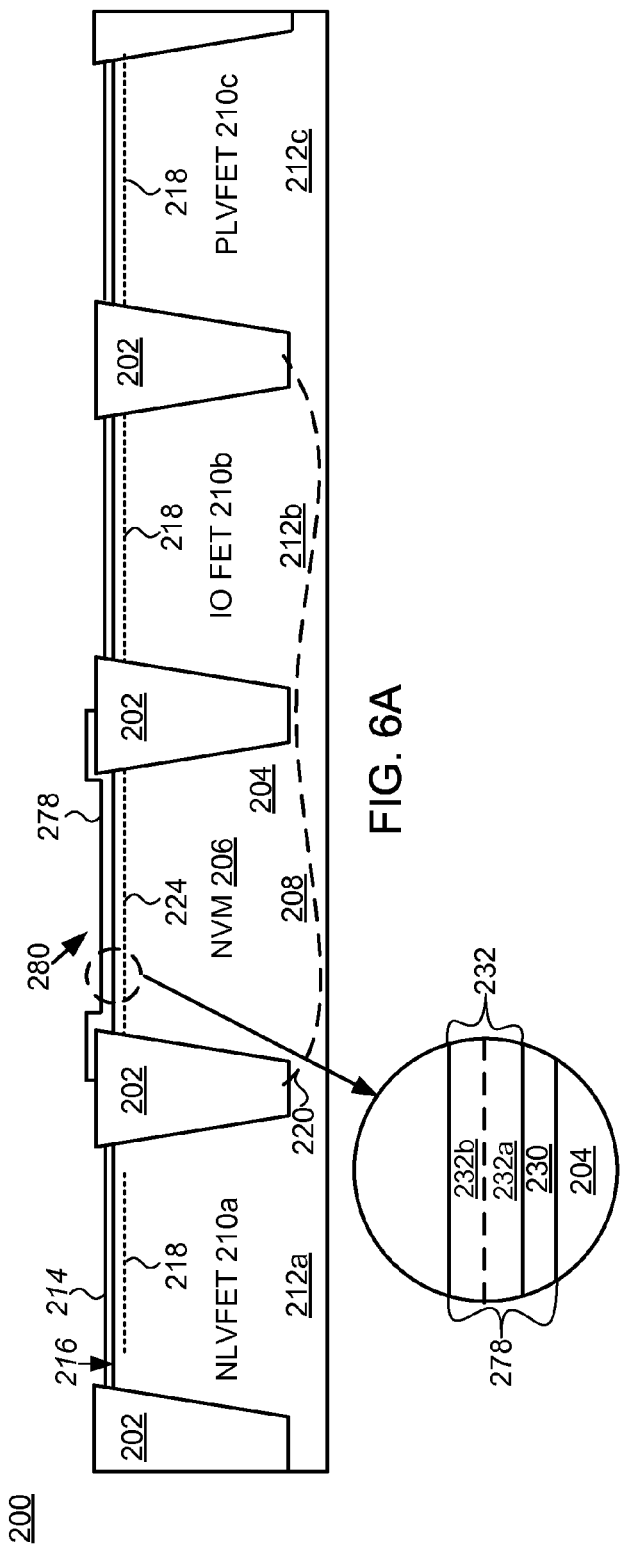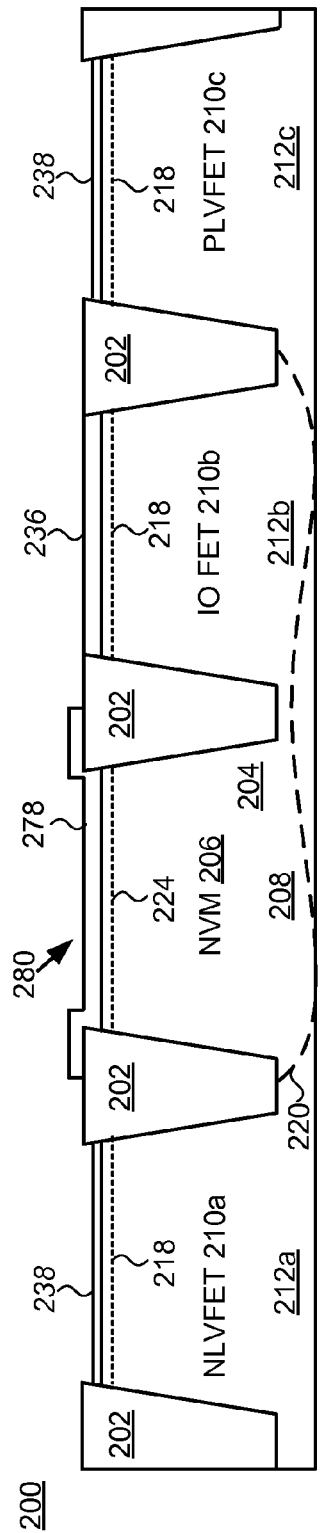

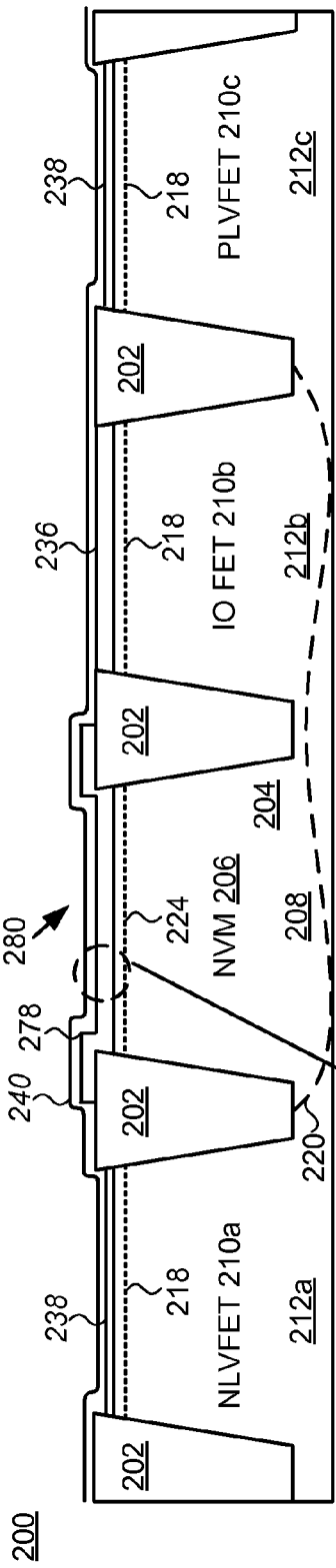
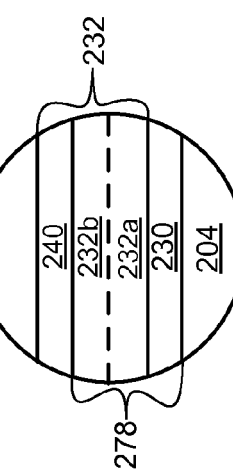
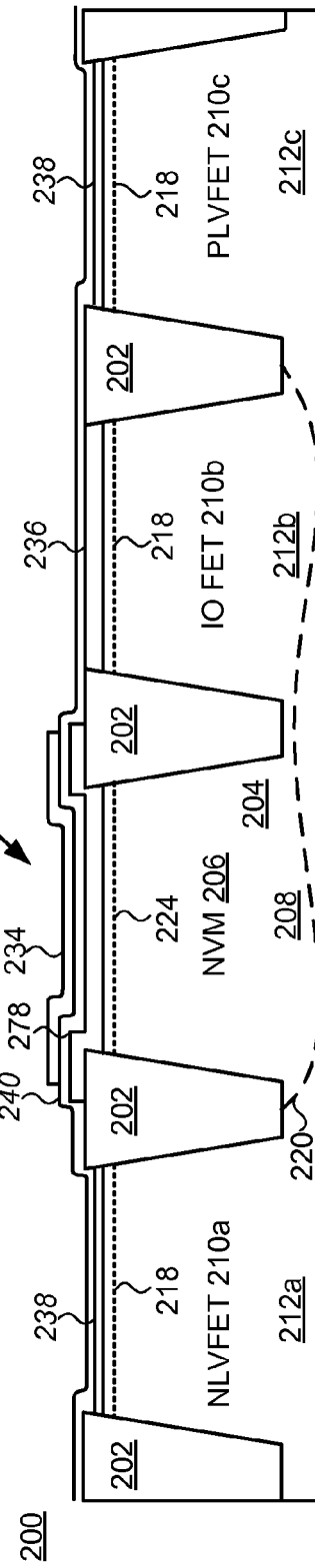
FIG. 6D
FIG. 6E
FIG. 6F

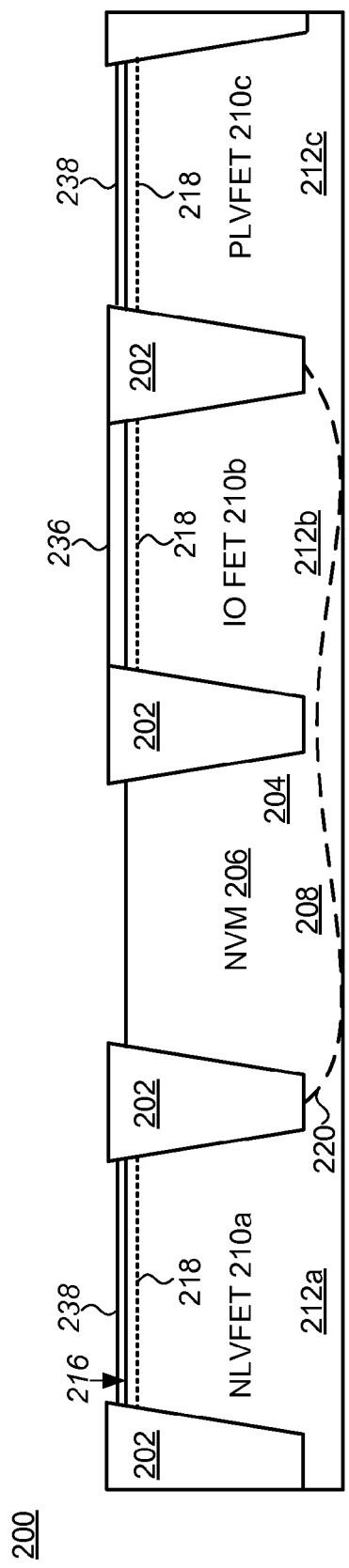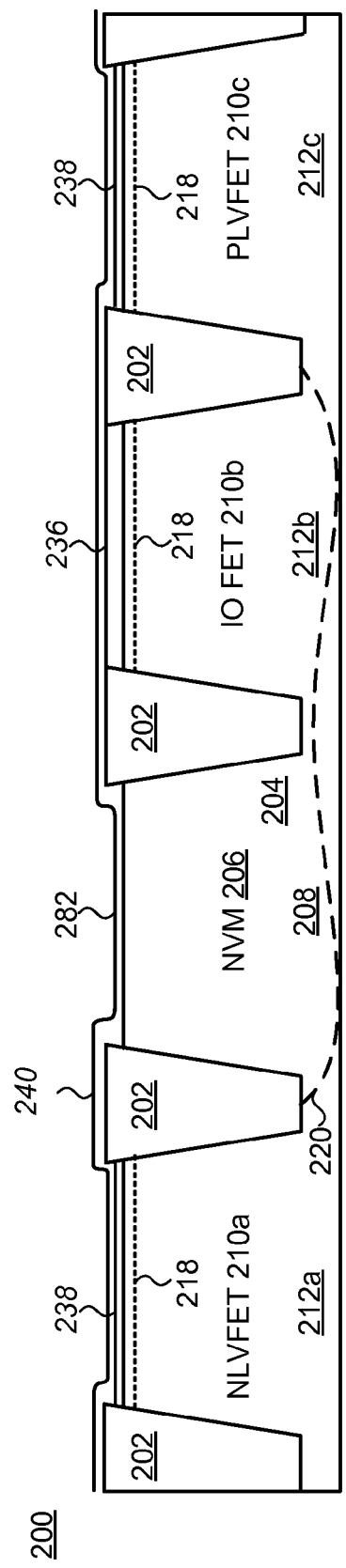

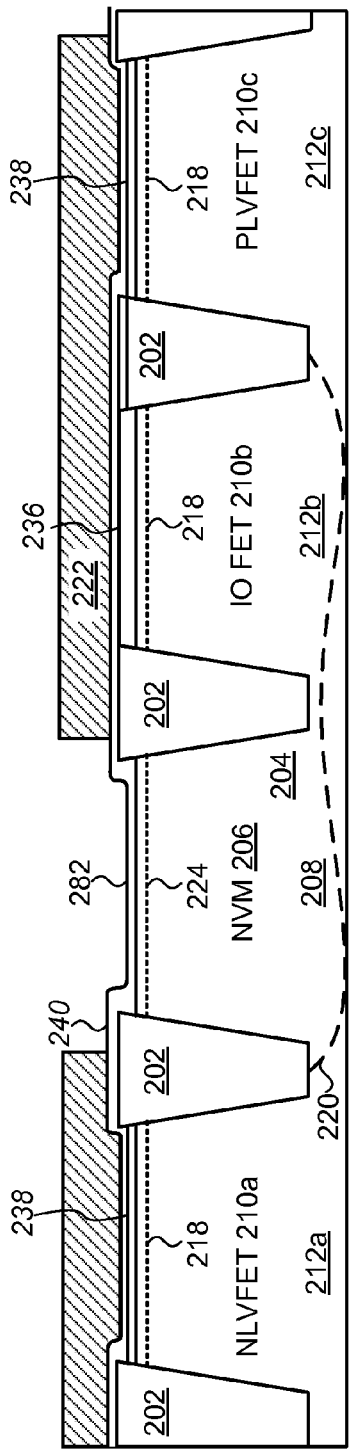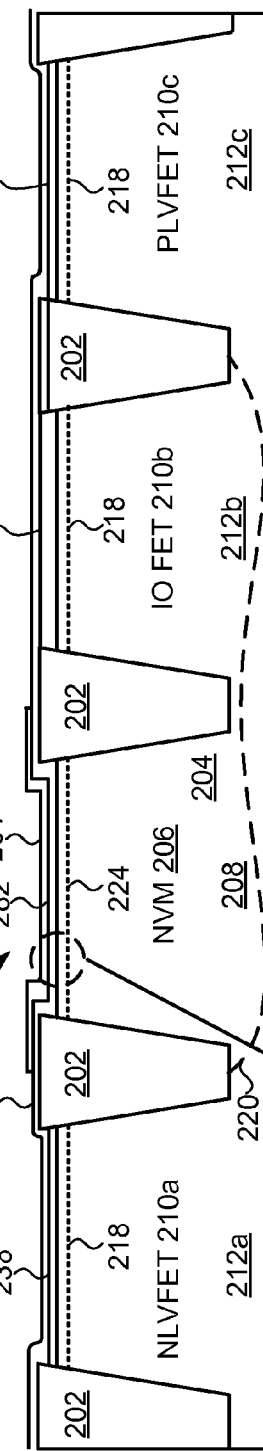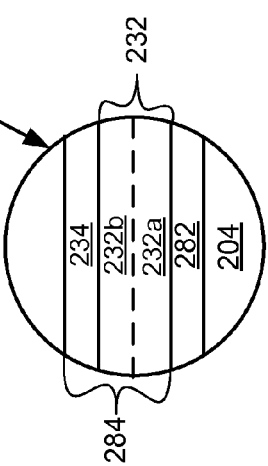

INTEGRATION OF A MEMORY TRANSISTOR INTO HIGH-K, METAL GATE CMOS PROCESS FLOW

CROSS-REFERENCE TO RELATED APPLICATIONS

This application is a continuation of U.S. patent application Ser. No. 14/229,594, filed on Mar. 28, 2014, and claims the benefit of priority under 35 U.S.C. 119(e) to U.S. Provisional Patent Application No. 61/883,873, filed Sep. 27, 2013, both of which are incorporated by reference herein.

TECHNICAL FIELD

The present disclosure relates generally to semiconductor devices, and more particularly to memory cells including embedded or integrally formed SONOS based non-volatile memory (NVM) transistors and metal-oxide-semiconductor (MOS) transistors including high-k dielectrics and metal gates and methods for fabricating the same.

BACKGROUND

For many applications, such as system-on-chip, it is desirable to integrate logic devices and interface circuits based upon metal-oxide-semiconductor (MOS) field-effect transistors and non-volatile memory (NVM) transistors on a single chip or substrate. This integration can seriously impact both the MOS transistor and NVM transistor fabrication processes. MOS transistors are typically fabricated using a standard or baseline complimentary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory (NVM) devices include non-volatile memory transistors, silicon-oxide-nitride-oxide-semiconductor (SONOS) based transistors, including charge-trapping gate stacks in which a stored or trapped charge changes a threshold voltage of the non-volatile memory transistor to store information as a logic 1 or 0. Charge-trapping gate stack formation involves the formation of a nitride or oxynitride charge-trapping layer sandwiched between two dielectric or oxide layers typically fabricated using materials and processes that differ significantly from those of the baseline CMOS process flow, and which can detrimentally impact or be impacted by the fabrication of the MOS transistors.

In particular, forming a gate oxide or dielectric of a MOS transistor can significantly degrade performance of a previously formed charge-trapping gate stack by altering a thickness or composition of the charge-trapping layer. At 28 nm and beyond, CMOS technologies will switch to using a thin High-k dielectric in place of the silicon dioxide or silicon oxynitride and metal gate instead of polysilicon. The process flow for these elements is significantly different than the current CMOS and NVM process flows. In addition, this integration can seriously impact the baseline CMOS process flow, and generally requires a substantial number of mask sets and process steps, which add to the expense of fabricating the devices and can reduce yield of working devices.

BRIEF DESCRIPTION OF THE DRAWINGS

Embodiments of the present invention will be understood more fully from the detailed description that follows and from the accompanying drawings and the appended claims provided below, where:

FIGS. 4A-4I are block diagrams illustrating cross-sectional views of a portion of a memory cell during fabrication of the memory cell according to the method of FIG. 3;

FIGS. 6A-6F are block diagrams illustrating cross-sectional views of a portion of a memory cell during fabrication of the memory cell according to the method of FIG. 5;

FIGS. 8A-8E are block diagrams illustrating cross-sectional views of a portion of a memory cell during fabrication of the memory cell according to the method of FIG. 7.

DETAILED DESCRIPTION

Embodiments of methods of integrating a non-volatile memory (NVM) transistor into a complimentary metal-oxide-semiconductor (CMOS) fabrication process or process flow including metal-oxide-semiconductor-field-effect-transistors (MOSFETs) with a high dielectric constant (high-k) gate dielectric and a metal gate to produce memory cells are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The NVM transistor may include memory transistors or devices implemented using Silicon-Oxide-Nitride-Oxide-Silicon (SONOS) or Metal-Oxide-Nitride-Oxide-Silicon (MONOS) technology.

Figure 1:
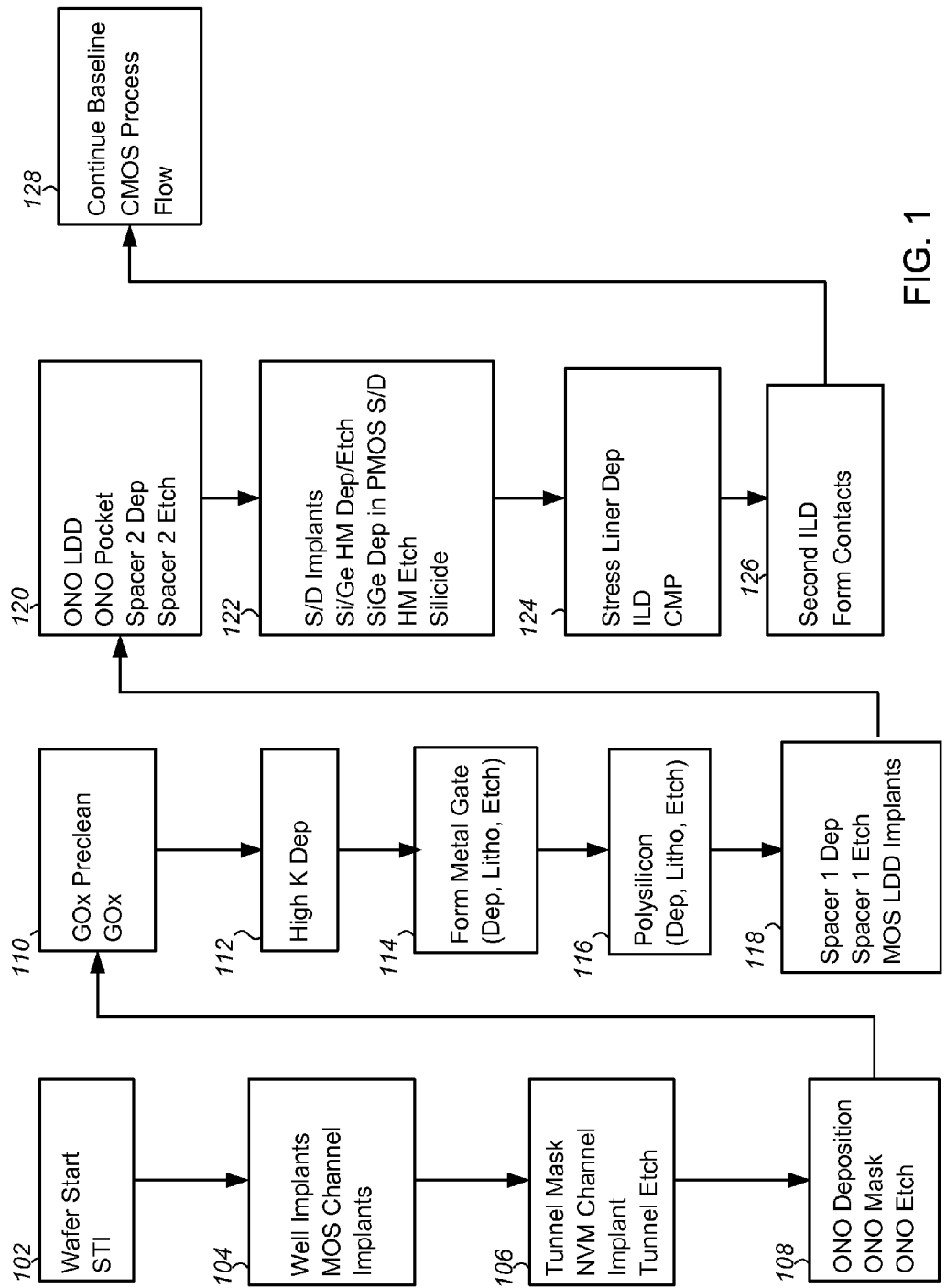
FIG. 1 is a flowchart illustrating an embodiment of a method for fabricating a memory cell including a non-volatile memory (NVM) transistor and metal-oxide-semiconductor (MOS) transistors including a high-k dielectric and a metal gate in a gate first scheme.
Figure 2A:
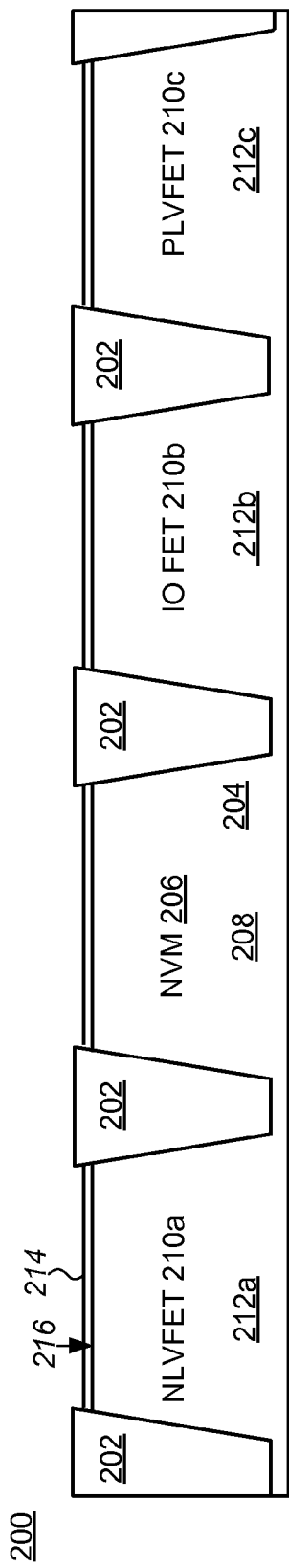
FIGS. 2A-2N are block diagrams illustrating cross-sectional views of a portion of a memory cell during fabrication of the memory cell according to the method of FIG. 1.

An embodiment of a method for integrating or embedding a NVM transistor into a high-k, metal gate CMOS process flow will now be described in detail with reference to FIG. 1 and FIGS. 2A through 2N. FIG. 1 is a flowchart illustrating an embodiment of a gate-first method or process flow. FIGS. 2A-2N are block diagrams illustrating cross-sectional views of a portion of a memory cell 200, including a NVM transistor and metal-oxide-semiconductor (MOS) transistors, during fabrication of the memory cell according to the method of FIG. 1.

Referring to FIG. 1 and FIG. 2A, the process begins with forming a number of isolation structures 202 in a wafer or substrate 204 (step 102). The isolation structures 202 isolate the memory cell being formed from memory cells formed in adjoining areas (not shown) of the substrate 204 and/or isolate the NVM transistor 206 being formed in a NVM region 208 of the substrate from one or more of the MOS transistors 210a-210c being formed in multiple adjoining MOS regions 212a-212c. The isolation structures 202 include a dielectric material, such as an oxide or nitride, and may be formed by any conventional technique, including but not limited to shallow trench isolation (STI) or local oxidation of silicon (LOCOS). The substrate 204 may be a bulk wafer composed of any single crystal or polycrystalline material suitable for semiconductor device fabrication, or may include a top epitaxial layer of a suitable material formed on a substrate. Suitable materials include, but are not limited to, silicon, germanium, silicon-germanium or a III-V compound semiconductor material.

Generally, as in the embodiment shown, a pad oxide 214 is formed over a surface 216 of the substrate 204 in both the NVM region 208 and the MOS regions 212a-212c. The pad oxide 214 can be silicon dioxide ($SiO_2$) having a thickness of from about 10 nanometers (nm) to about 20 nm and can be grown by a thermal oxidation process or in-situ steam generation (ISSG).

Figure 2B:
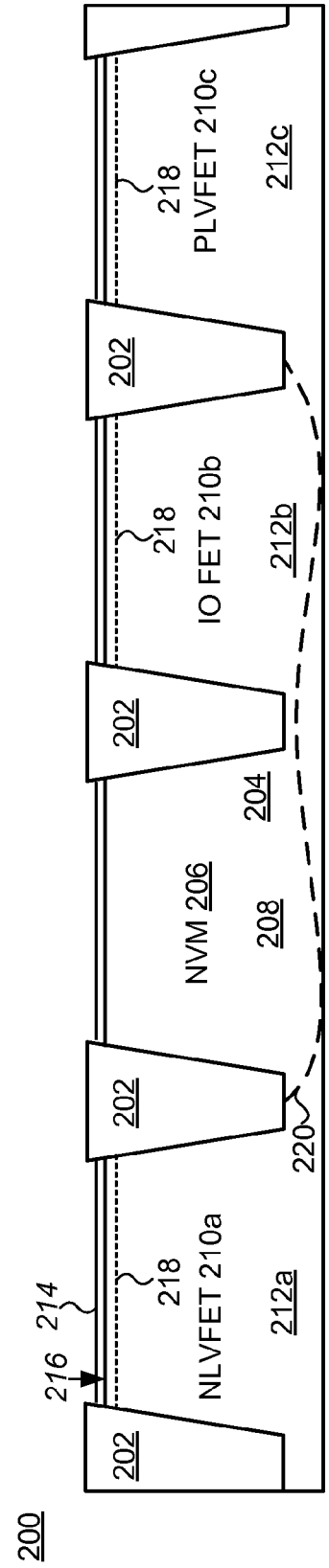

Referring to FIG. 1 and FIG. 2B, dopants are then implanted into substrate 204 through the pad oxide 214 to concurrently form wells in the NVM region 208 and one or more of the MOS regions 212a-c, and to form channels 218 for MOS transistors that will be formed in the MOS regions (step 104). The dopants implanted may be of any type and concentration, and may be implanted at any energy, including energies necessary to form wells or deep wells for an NVM transistor 206 and/or MOS transistors 210a-210c, and to form channels for MOS transistors. In a particular embodiment illustrated in FIG. 2B, dopants of an appropriate ion species are implanted to form a deep N-well 220 in the NVM region and in a MOS region 212b over or in which a high-voltage (HV) transistor, such as an input/output field effect transistor (I/O FET), will be formed. Although not shown, it is to be understood that wells or deep wells can also be formed for the standard or low-voltage transistor, such as a low voltage field effect transistor (LVFET), in MOS regions 212a and 212c. The LVFET can be a PMOS LVFET (PLVFET) or a NMOS LVFET (NLVFET) and the dopants for the well selected accordingly. It is further to be understood that the wells are formed by depositing and patterning a mask layer, such as a photoresist or PR layer above the surface 216 of the substrate 204, and implanting an appropriate ion species at an appropriate energy to an appropriate concentration.

Channels 218 for one or more of the MOS transistors 210a-210c, are formed in one or more of the MOS regions 212a-c of the substrate 204. As with the well implant the channels 218 are formed by depositing and patterning a mask layer, such as a photoresist layer above the surface 216 of the substrate 204, and implanting an appropriate ion species at an appropriate energy to an appropriate concentration. For example, $BF_2$ can be implanted at an energy of from about 10 to about 100 kilo-electron volts (keV), and a dose of from about 1e12 $cm^{-2}$ to about 1e14 $cm^{-2}$ to form an N-type MOS (NMOS) transistor. A P-type MOS (PMOS) transistor may likewise be formed by implantation of Arsenic or Phosphorous ions at any suitable dose and energy. It is to be understood that implantation can be used to form channels 218, in all of the MOS regions 212a-c at the same time, or at separate times using standard lithographic techniques, including a patterned photoresist layer to mask one of the MOS regions.

Next, referring to FIG. 1 and FIG. 2C a patterned tunnel mask 222 is formed on or overlying the MOS regions 212a-c, and dopants of an appropriate, energy and concentration are implanted through a window or opening in the tunnel mask to form a channel 224 for a NVM transistor 206, and the tunnel mask and the pad oxide 214 in at least the NVM region 208 removed (step 106). The tunnel mask can include a photoresist layer, or a hard mask formed, from a patterned nitride or silicon-nitride layer.

In one embodiment, the channel 224 can be implanted with boron ions ($BF_2$) at an energy of from about 50 to about 500 kilo-electron volts (keV), and a dose of from about 5e11 $cm^{-2}$ to about 5e12 $cm^{-2}$ to form a p-channel NVM transistor 206. Alternatively, Arsenic or Phosphorous can be implanted through the pad oxide 214 to form a n-channel NVM transistor 206.

The pad oxide 214 over the NVM region 208 is removed through the mask 222, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. The photoresist tunnel mask 222 can be ashed or stripped using oxygen plasma. A hard mask can be removed using a wet or dry etch process.

Referring to FIG. 1 and FIGS. 2D-2E, a number of dielectric or oxide-nitride-oxide (ONO) layers, shown collectively as ONO layers 226, are formed or deposited over the surface 216 of the substrate 204, a mask formed on or overlying the ONO layers, and the ONO layers etched to form a gate stack 228 of a NVM transistor 206 in the NVM region 208 (step 108). Optionally, this step can be preceded by a preclean accomplished using a wet or dry process. In one particular embodiment, the preclean includes a wet process using HF or standard cleans (SC1) and SC2 that are highly selective to the material of the substrate 204. SC1 is typically performed using a 1:1:5 solution of ammonium hydroxide ($NH_4OH$), hydrogen peroxide ($H_2O_2$) and water ($H_2O$) at 50 to 80° C. for about 10 minutes. SC2 is a short immersion in a 1:1:10 solution of HCl, $H_2O_2$ and $H_2O$ at about 50 to 80° C.

Referring to FIG. 2E, the dielectric or ONO deposition begins with the formation of a tunnel dielectric 230 over at least the channel 224 of a NVM transistor 206 in the NVM region 208 of the substrate 204. The tunnel dielectric 230 may be any material and have any thickness suitable to allow charge carriers to tunnel into an overlying charge-trapping layer under an applied gate bias while maintaining a suitable barrier to leakage when the NVM transistor 206 is unbiased. In certain embodiments, tunnel dielectric 230 is silicon dioxide, silicon oxy-nitride, or a combination thereof and can be grown by a thermal oxidation process, using ISSG or radical oxidation.

In one embodiment a silicon dioxide tunnel dielectric 230 may be thermally grown in a thermal oxidation process. For example, a layer of silicon dioxide may be grown utilizing dry oxidation at 750 degrees centigrade (° C.)-800° C. in an oxygen containing gas or atmosphere, such as oxygen ($O_2$) gas. The thermal oxidation process is carried out for a duration approximately in the range of 50 to 150 minutes to effect growth of a tunnel dielectric 230 having a thickness of from about 1.0 nanometers (nm) to about 3.0 nm by oxidation and consumption of the exposed surface of substrate.

In another embodiment a silicon dioxide tunnel dielectric 230 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1000° C. at a pressure approximately in the range of about 0.5 to about 5 Torr to form radicals, such as, an OH radical, an $HO_2$ radical or an O diradical, at the surface of substrate. The radical oxidation process is carried out for a duration approximately in the range of about 1 to about 10 minutes to effect growth of a tunnel dielectric 230 having a thickness of from about 1.0 nanometers (nm) to about 4.0 nm by oxidation and consumption of the exposed surface of substrate. It will be understood that in this and in subsequent figures the thickness of tunnel dielectric 230 is exaggerated relative to the pad oxide 214, which is approximately 7 times thicker, for the purposes of clarity. A tunnel dielectric 230 grown in a radical oxidation process is both denser and is composed of substantially fewer hydrogen atoms/$cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 230 without impacting the throughput (wafers/hr.) requirements that a fabrication facility may require.

In another embodiment, tunnel dielectric 230 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric 230 is a multilayer tunnel dielectric including at least a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2E, a charge-trapping layer 232 is formed on or overlying the tunnel dielectric 230. Generally, as in the embodiment shown, the charge-trapping layer is a multilayer charge-trapping layer comprising multiple layers including at least an oxygen-rich, substantially charge trap free lower or first charge-trapping layer 232a closer to the tunnel dielectric 230, and an upper or second charge-trapping layer 232b that is silicon-rich and oxygen-lean relative to the first charge-trapping layer and comprises a majority of a charge traps distributed in multilayer charge-trapping layer.

The first charge-trapping layer 232a of a multilayer charge-trapping layer 232 can include a silicon nitride ($Si_3N_4$), silicon-rich silicon nitride or a silicon oxy-nitride ($SiO_xN_y$ ($H_z$)). For example, the first charge-trapping layer 232a can include a silicon oxynitride layer having a thickness of between about 1.5 nm and about 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 232b of the multilayer charge-trapping layer is then formed over the first charge-trapping layer 232a. The second charge-trapping layer 232b can include a silicon nitride and silicon oxy-nitride layer having a stoichiometric composition of oxygen, nitrogen and/or silicon different from that of the first charge-trapping layer 232a. The second charge-trapping layer 232b can include a silicon oxynitride layer having a thickness of between about 2.0 nm and about 10.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

Referring again to FIG. 2E, the number of dielectric layers further includes a blocking dielectric layer or blocking dielectric 234 that is formed on or overlying the charge-trapping layer 232. In one embodiment, the blocking dielectric 234 can include an oxidized portion of the silicon nitride of the underlying second charge-trapping layer 232b, which is subsequently oxidized by in-situ-steam-generation (ISSG), or radical oxidation to form the blocking dielectric 234. In other embodiments, the blocking dielectric 234 can include a silicon oxide ($SiO_2$) or a silicon oxynitride (SiON), deposited by CVD, performed in a batch or single substrate processing chamber with or without an ignition event such as plasma. The blocking dielectric 234 can be a single layer of silicon oxide, having a substantially homogeneous composition, a single layer of silicon oxynitride having a gradient in stoichiometric composition, or, as in embodiments described below, can be a multilayer blocking dielectric including at least a lower or first blocking dielectric layer overlying the second charge-trapping layer 232b, and a second blocking dielectric layer overlying the first blocking dielectric layer.

In one embodiment, the blocking dielectric 234 can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures.

Figure 2F:
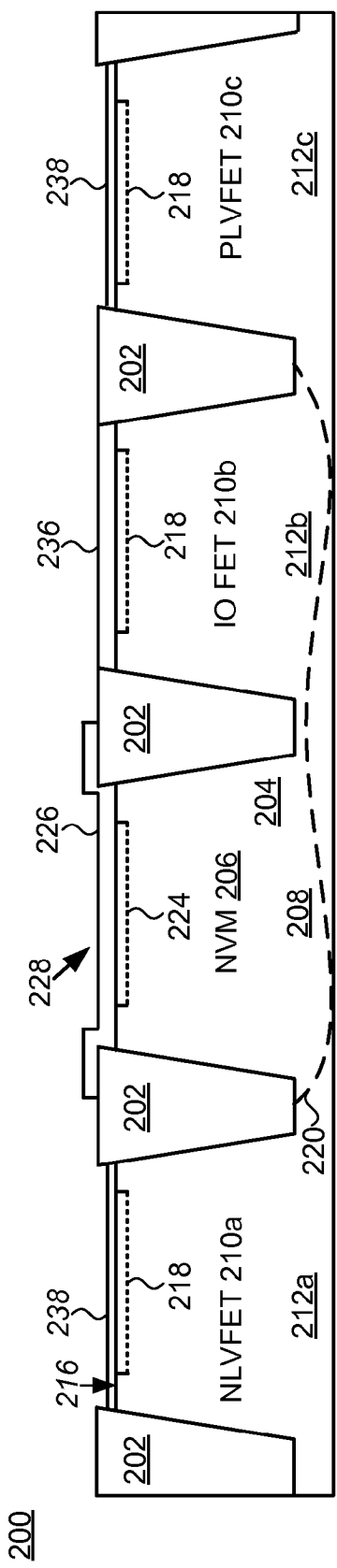

Referring to FIGS. 1 and 2F, a gate oxide or GOX preclean is performed, and gate oxides for MOS transistors 210a-210c formed in the MOS regions 212a-c (step 110). Referring to FIG. 2F, the GOX preclean removes the pad oxide 214 from the MOS regions and at least a portion of the blocking dielectric 234 in a highly selective cleaning process. This cleaning process prepares the substrate 204 in the MOS regions 212a-c for gate oxide growth. In one exemplary implementation the pad oxide 214 is removed in a wet clean process. Alternatively, the wet clean process can be performed using a 20:1 BOE wet etch, a 50:1 hydrofluoric (HF) wet etch, a pad etch, or any other similar hydrofluoric-based wet etching chemistry. In other embodiments, the cleaning process chemistry is chosen so as to remove only a negligible portion of the blocking dielectric 234.

In some embodiments, such as that shown in FIG. 2F, the oxidation process to form gate oxides for MOS transistors 210a-210c is a dual gate oxidation process to enable fabrication of both a first, thick, gate oxide 236 over the surface 216 of the substrate 204 in one MOS region 212b for a HV transistor, such as I/O FET 210b, and second, thinner gate oxides 238 for LV transistors, such as NLVFET 210a and PLVFET 210c, in the remaining MOS regions 212a and 212c. Generally, the dual gate oxidation process involves forming the thicker gate oxide 236 over all MOS regions 212a-212c, using any known oxidation process in accordance with the methods described herein, forming a patterned photoresist mask using standard lithographic techniques covering MOS region 212b and NVM region 208, and removing the thick gate oxide in MOS regions 212a and 212c by a wet etch process using a 10:1 buffered oxide etch (BOE) containing a surfactant, after which the photoresist mask is stripped or removed, and the second, thinner gate oxides 238 grown or deposited. The thinner gate oxides 238 can be grown, for example, to a thickness from about 1 nm to about 3 nm. It will be understood that, by controlling the thickness of the thick gate oxide 236 as initially formed there is no need to form an additional photoresist mask over the MOS region 212b since the additional oxide merely adds insubstantially to the thickness of the thick gate oxide. Similarly, the oxidation process to form the thinner gate oxides 238 will have little to no detrimental impact on the blocking dielectric 234.

In another embodiment, the oxidation process to form the thick gate oxide 236 is also used to concurrently form a high-temperature-oxide (HTO) over the gate stack 228 of the NVM transistor 206 to provide a thicker oxide blocking dielectric 234 or an additional HTO layer of a multilayer blocking dielectric. The oxidation process can include in-situ-steam-generation (ISSG), CVD, or radical oxidation performed in a batch or single substrate processing chamber with or without an ignition event such as plasma. For example, in one embodiment the thick gate oxide 236 and the additional or thicker oxide layer of the blocking dielectric 234 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 800-1000° C. at a pressure approximately in the range of 0.5-10 Torr to form radicals, such as, an OH radical, an $HO_2$ radical or an O diradical radicals at a surface of the blocking dielectric 234. The oxidation process is carried out for a duration approximately in the range of 1-5 minutes for a single substrate using an ISSG process, or 10-15 minutes for a batch furnace process to effect growth of the blocking dielectric 234 having a thickness of from about 2 nm to about 4.5 nm, and a thick gate oxide 236 having a thickness of from about 3 nm to about 7 nm.

Figure 2G:
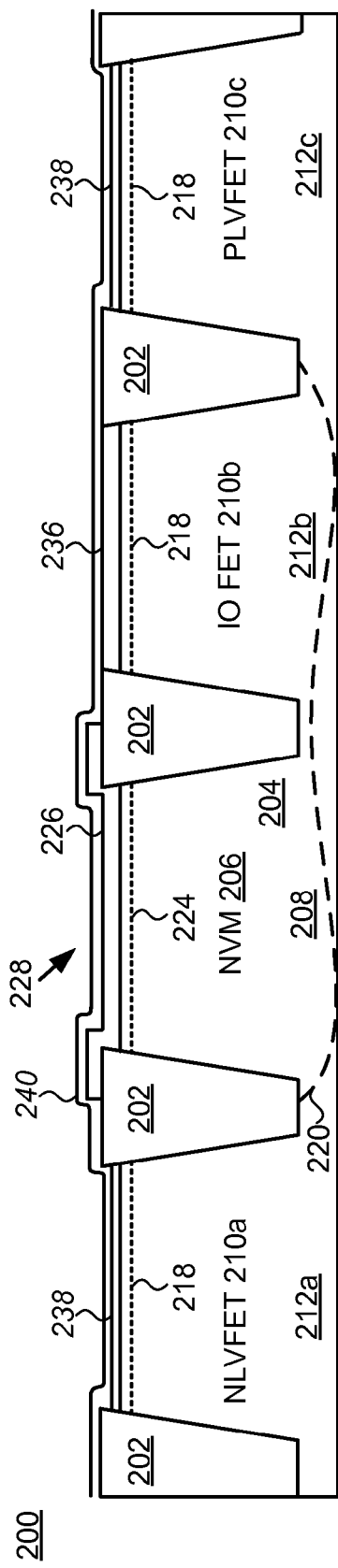

Next, referring to FIGS. 1 and 2G, a high dielectric constant or high-k dielectric material 240 is formed or deposited on or over the gate stack of the NVM transistor 206, in the NVM region 208 and in the MOS regions 212a-c to concurrently form a multilayer blocking dielectric 234 including the high-k dielectric material in the gate stack 228 of the NVM transistor and multilayer gate dielectrics including the gate oxides 236 or 238, and the high-k dielectric material in the MOS regions (step 112). The high-k dielectric material 240 may include, but is not limited to, hafnium oxide, zirconium oxide, hafnium silicate, hafnium oxynitride, hafnium zirconium oxide and lanthanum oxide deposited to a physical thickness between about 3.0 nm and about 8.0 nm by, for example, atomic layer deposition (ALD), physical vapor deposition (PVD), a chemical vapor deposition (CVD), a low pressure CVD (LPCVD) or a plasma enhanced CVD (PECVD) process.

Figure 2H:
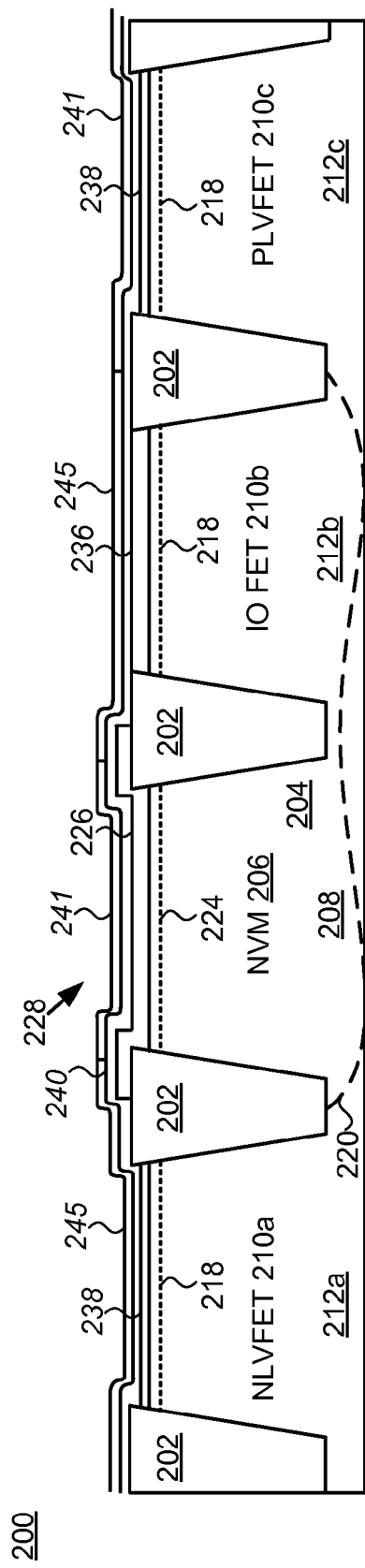

Referring to FIGS. 1 and 2H, metal layers of multi-layer gates are formed for the MOS transistors 210a-210c and, optionally, over the NVM transistor 206 (step 114). In one embodiment, a first or P+ metal layer 241 (high work function metal) is deposited over substantially the entire surface of the substrate 204 and all layers and structures formed thereon, a patterned photoresist mask (not shown) formed using standard lithographic techniques and the P+ metal layer etched to remove the first or P+ metal layer from MOS regions 210a and 210b, stop on surfaces of the high-k dielectric material 240, thereby forming a high work function gate 242 for a P-type low voltage MOS transistor (PLVFET 210c) and, optionally, a high work function gate 244 for the NVM transistor 206. The P+ metal layer 241 can include aluminum, Titanium or compounds or alloys thereof, deposited to a thickness of from about 20 nm to about 100 nm, using physical or chemical vapor deposition. Next, a second or N+ metal layer 245 (low work function) is deposited over substantially the entire surface of the substrate 204, including the gate 242 of the PLVFET 210c and the gate 244 of the NVM transistor 206, a patterned photoresist mask formed and the N+ metal layer etched to form a non-high or low work function metal gate 246 for a N-type low voltage MOS transistor (NLVET 210a), and a low work function metal gate 248 for the I/O FET 210b. Optionally, if a high work function gate for the NVM transistor 206 has not been formed from the first or P+ metal layer 241, a low work function gate 244 may instead be concurrently formed for the NVM transistor 206. The N+ metal layer 245 can include Titanium, Lanthanum, Aluminum, or compounds or alloys thereof, deposited to a thickness of from about 20 nm to about 100 nm, using physical or chemical vapor deposition.

Figure 2I:
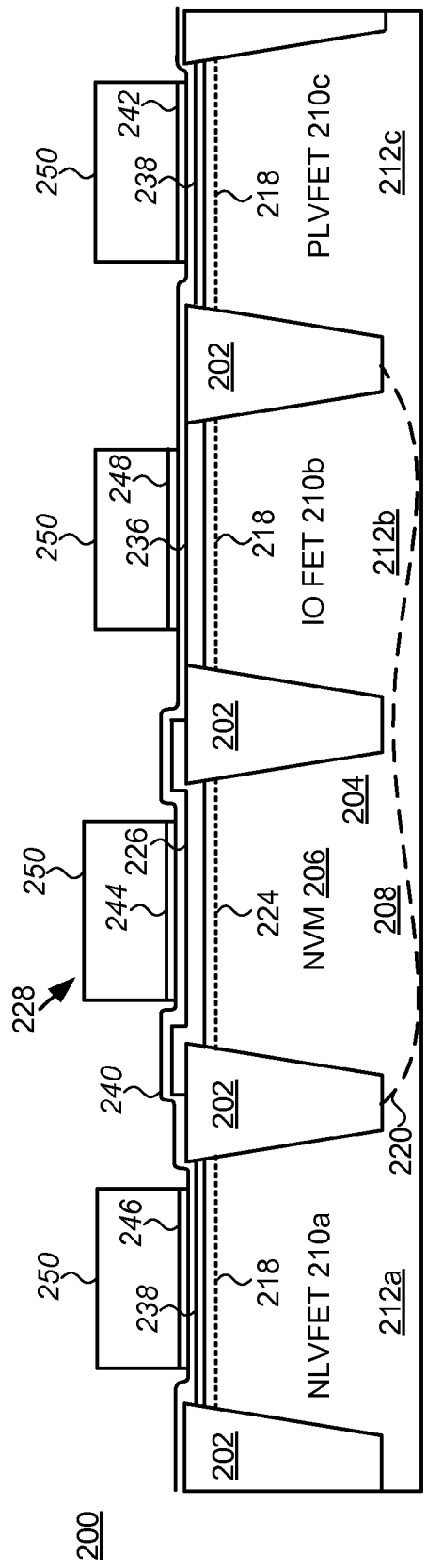
Figure 2N:
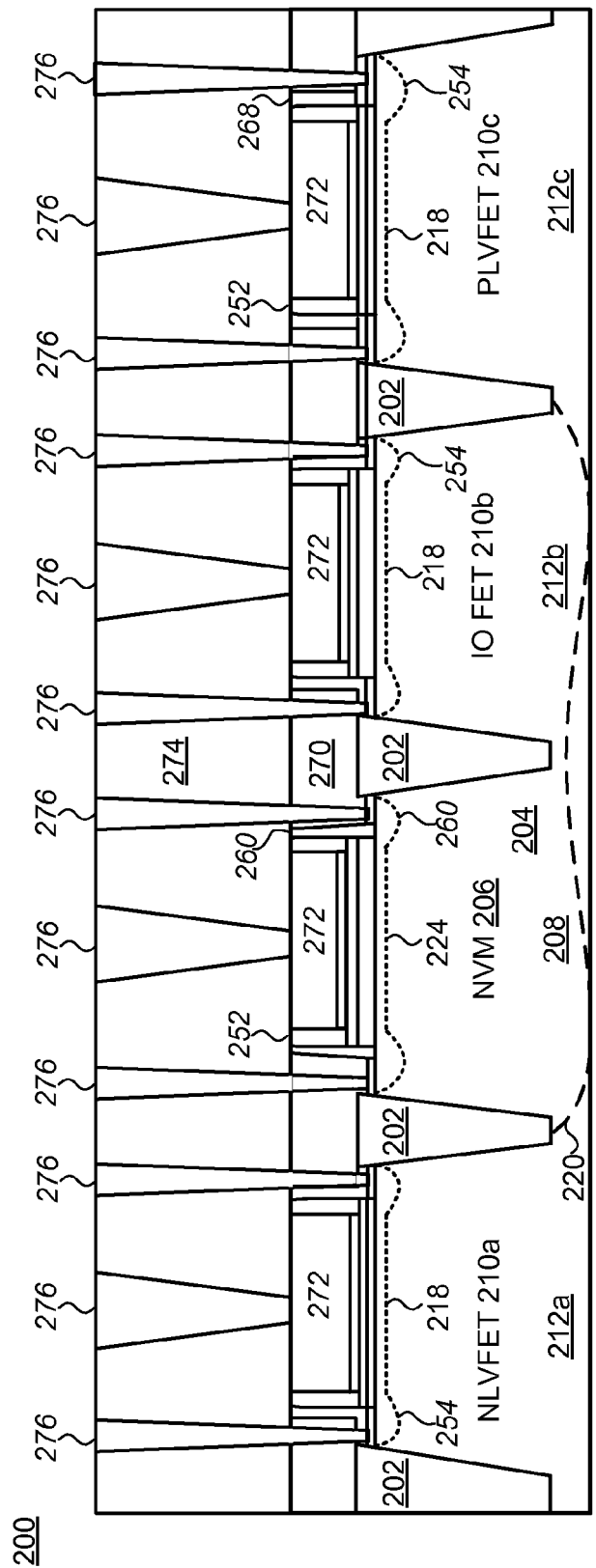

Next, referring to FIGS. 1 and 2I, a polysilicon or poly layer is deposited or formed over substantially the entire surface of the substrate 204 and all layers and structures formed thereon, a patterned photoresist mask (not shown) formed using standard lithographic techniques and the polysilicon layer and the underlying metal layers 241 and 245 etched to stop on surfaces of the high-k dielectric material 240, thereby forming metal-polysilicon gates 250 of the MOS transistors 210a-c and the NVM transistor 206 (step 116). The polysilicon layer can be deposited using chemical vapor deposition (CVD) to a thickness of from about 30 nm to about 100 nm, and etched using standard polysilicon etch chemistries, such as $CHF_3$ or $C_2H_2$ or $HBr/O_2$ which are highly selective to the underlying metal, followed by a metal etch which is highly selective to the material of the high-k dielectric material 240.

Referring to FIGS. 1 and 2J, a first spacer layer is deposited and etched to form first sidewall spacers 252 adjacent to the polysilicon gates 250 and the metal gates 242, 244, 246 and 248, of the MOS transistors 210a-c and the NVM transistor 206, and one or more lightly-doped drain extensions (MOS LDD 254) are implanted adjacent to and one or more of the MOS transistors (step 118). The first spacer layer can include silicon oxide, deposited to a thickness of from about 10 nm to about 30 nm, using any known CVD technique as described herein. The MOS LDDs 254 are formed by implanting an appropriate ion species at an appropriate energy to an appropriate concentration. For example, drain extensions 254 of the PLVFET 210a can be formed by forming a photoresist mask through which MOS region 212c is exposed and implanting boron ions ($BF_2$) at an energy of from about 10 to about 100 kilo-electron volts (keV), and a dose of from about 1e12 $cm^{-2}$ to about 5e14 $cm^{-2}$ through the photoresist mask. Optionally, pocket or halo implants (not shown) for the PLVFET 210c can be done through the same photoresist mask, by implanting Arsenic or Phosphorus at energy of 20 to 70 kilo-electron volts (KeV) and a dose of 2e12 $cm^{-2}$ to about 5e12 $cm^{-2}$. Similarly, MOS LDDs 254 of the NLVET 210a and the I/O FET 210b can be formed by implanting Arsenic or Phosphorus at energy of from about 10 to about 100 kilo-electron volts (keV), and a dose of from about 1e12 $m^{-2}$ to about 5e14 $cm^{-2}$, also through an appropriately patterned photoresist mask. Halo or pocket implants for the NLVFET can also be done through this mask using Boron ($BF_2$) at energy of 5 to about 50 kilo-electron volts and a dose of 1e12 $cm^{-2}$ to 5e12 $cm^{-2}$.

Next, referring to FIGS. 1 and 2K a ONO LDD mask is formed over the substrate 204, lightly-doped drain extensions (ONO LDD 256) are implanted, adjacent to the NVM transistor 206, SONOS pocket or halo implants 258 extending partially into the channel region 224 under the gate stack 228 of the NVM transistor implanted. The ONO LDD 256 and the sidewall spacers 252 can be formed using techniques substantially the same as those described above with respect to the MOS LDD 254 and the first sidewall spacers 252. For example, in one embodiment the LDD implants 256 can be formed by an angled implant of, for example, Arsenic or Phosphorous at an energy of from about 5 to about 25 kilo-electron volts (keV), and a dose of from about 5 e12 $cm^{-2}$ to about 2 e14 $cm^{-2}$. Pocket or halo implants 258 can be formed by implanting ($BF_2$) with energy of 10 to 30 kilo-electron volts and a dose of 1e12 $cm^{-2}$ to 3e12 $cm^{-2}$. A second spacer layer is deposited and etched to form second sidewall spacers 260 adjacent to the first sidewall spacers 252, of the NVM transistor and MOS transistors (step 120).

Referring to FIGS. 1 and 2L, source and drain implants are performed to form source and drain (S/D) regions 262 for the NVM transistor 206 and all of the MOS transistors 210a-c, a hard mask (HM) formed and patterned to expose only the S/D regions of the PLVFET 210c, a silicon-germanium (SiGe) layer deposited and etched, and the hard mask removed to form a strain inducing layer 264 over the S/D regions of the PLVFET (step 122). Additionally, as depicted, a silicide process can be performed to form silicide 266 on the exposed source and drain regions 262. The silicide process may be any commonly employed in the art, typically including a pre-clean etch, nickel metal deposition, anneal and wet strip.

Referring to FIGS. 1 and 2M, the method further includes forming a stress inducing structure or layer 268, such as a stress inducing nitride layer, over the MOS transistors 210a-c, depositing an interlevel dielectric (ILD) layer 270 over substantially the entire surface of the substrate 204 and all layers and structures formed thereon, and the ILD layer planarized, for example, using a chemical mechanical polishing (CMP) process (step 124). The stress inducing layer 268 can include, a compressive or tensile nitride layer formed using a plasma enhanced chemical vapor deposition (PECVD) or a Bis-TertiaryButylAmino Silane (BTBAS) nitride layer, deposited or grown to a thickness of from about 30 nm to about 70 nm, using any known technique including chemical vapor deposition. The ILD layer 270 can include, for example, silicon oxide, deposited or grown to a thickness of from about 0.5 μm to about 1.0 μm, using any known CVD technique as described above.

Referring FIGS. 1 and 2N, a second ILD layer 274 is deposited over substantially the entire surface of the substrate 204 and all layers and structures formed thereon, and contacts 276 are formed to the S/D regions and gates for the NVM transistor and all of the MOS transistors (step 126). The second ILD layer 274 can include, for example, silicon oxide, deposited or grown to a thickness of from about 0.5 μm to about 1.0 μm, using any known CVD technique as described above. In an alternate embodiment, the second ILD layer 274 can be substantially reduced or omitted entirely, and the contacts 276 formed through just the first ILD layer 272. The contacts 276 can be formed by forming a patterned PR mask over the second ILD layer 274, etching the second ILD layer using any of the standard oxide etch processes as described above to stop on the silicide 266. The contact openings thus formed are then filled with a metal, such as tungsten, using chemical vapor deposition.

Finally, the standard or baseline CMOS process flow is continued to substantially complete the front end device fabrication (step 128), yielding the structure shown in FIG. 2N.

Figure 3:
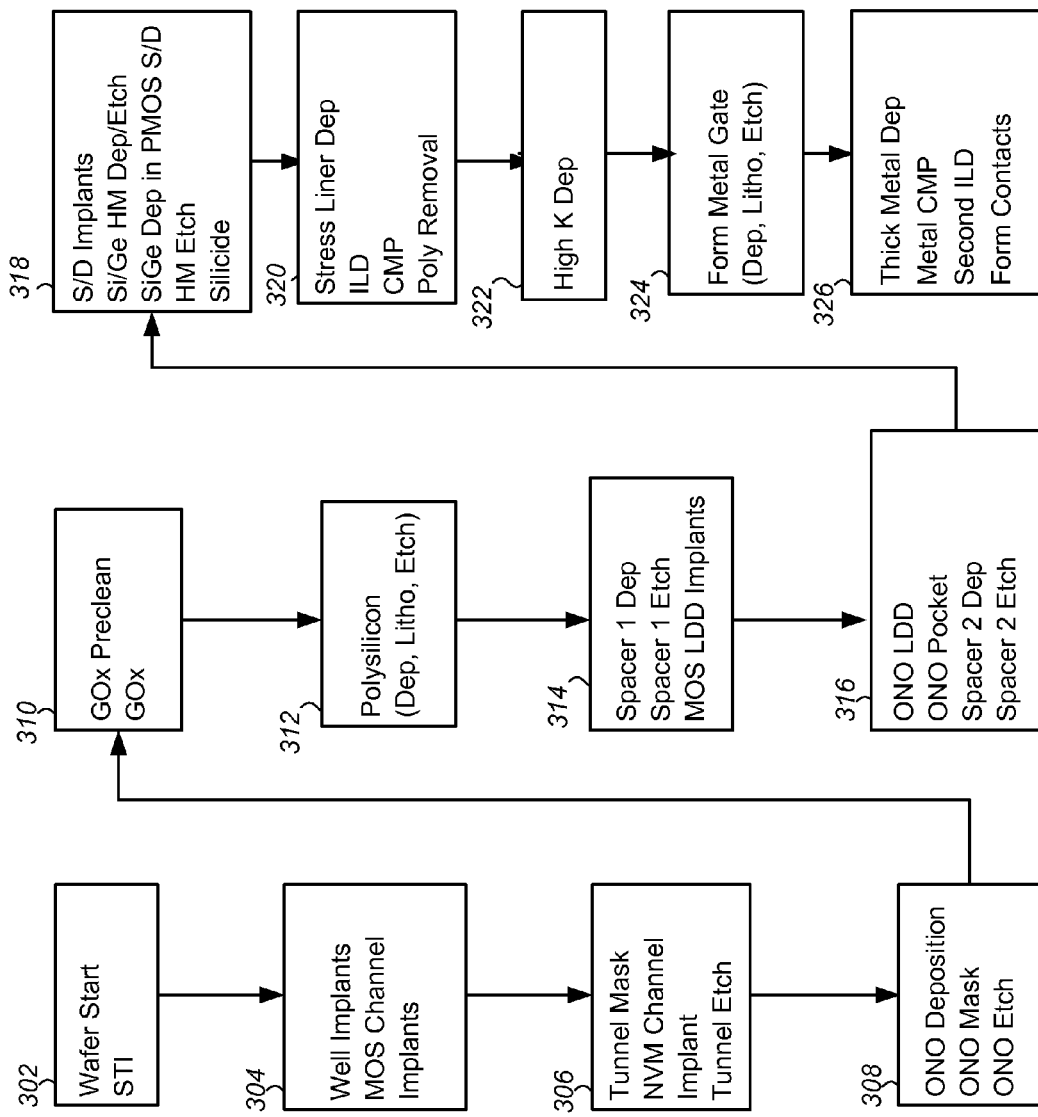
FIG. 3 is a flowchart illustrating another embodiment of another method for fabricating a memory cell including a NVM transistor and MOS transistors including a high-k dielectric and a metal gate in a gate last scheme.

An embodiment of another method for integrating or embedding a NVM transistor into a high-k, metal gate CMOS process flow will now be described in detail with reference to FIG. 3 and FIGS. 4A through 4I. FIG. 3 is a flowchart illustrating an embodiment of a gate-last method or process flow. FIGS. 4A-4I are block diagrams illustrating cross-sectional views of a portion of a memory cell 200, including a NVM transistor and MOS transistors, during fabrication of the memory cell according to the method of FIG. 3.

Referring to FIG. 3, as with the gate-first method described above the process begins with forming a number of isolation structures 202 in a wafer or substrate 204 (step 302). At this point the memory cell 200 is substantially identical to that described above and shown in FIG. 2A.

Next, referring to FIG. 3, dopants are then implanted into substrate 204 through the pad oxide 214 to concurrently form wells in the NVM region 208 and one or more of the MOS regions 212a-c, and to form channels 218 for MOS transistors that will be formed in the MOS regions (step 304). At this point the memory cell 200 is substantially identical to that described above and shown in FIG. 2B.

Referring to FIG. 3 a patterned tunnel mask 222 is formed on or overlying the MOS regions 212a-c, and dopants of an appropriate, energy and concentration are implanted through a window or opening in the tunnel mask to form a channel 224 for a NVM transistor 206, and the tunnel mask and the pad oxide in at least the NVM region 208 removed (step 306). At this point the memory cell 200 is substantially identical to that described above and shown in FIG. 2C.

Next referring to FIG. 3 a number of dielectric or oxide-nitride-oxide (ONO) layers, shown collectively as ONO layers 226, are formed or deposited the surface 216 of the substrate 204, a mask formed on or overlying the ONO layers, and the ONO layers etched to form a gate stack 228 of a NVM transistor 206 in the NVM region 208 (step 308). At this point the memory cell 200 is substantially identical to that described above and shown in FIGS. 2D-2E.

Referring to FIG. 3, a gate oxide or GOX preclean is performed, and gate oxides for MOS transistors 210a-210c formed in the MOS regions 212a-c (step 310). At this point the memory cell 200 is substantially identical to that described above and shown in FIG. 2F. In some embodiments, such as that shown in FIG. 2F, the oxidation process is a dual gate oxidation process to enable fabrication of both a first, thick gate oxide 236 over the surface 216 of the substrate 204 in one MOS region 212b for a HV transistor, such as I/O FET 210b, and second, thinner gate oxides 238 LV transistors 216, such as NLVFET 210a and PLVFET 210c, in the remaining MOS regions 212a and 212c.

Next referring to FIGS. 3 and 4A, a polysilicon or poly layer is deposited or formed over substantially the entire surface of the substrate 204 including thick gate oxide 236, the thin gate oxides 238 and the blocking dielectric 234, a patterned photoresist mask (not shown) formed using standard lithographic techniques and the polysilicon layer etched to stop on the surface 216 of the substrate 204, thereby forming dummy polysilicon gates 250 over the gate oxides 236 and 238 of the MOS transistors 210a-c and the ONO layers 226 in the gate stack 228 of the NVM transistor 206 (step 312). The polysilicon layer can be deposited, masked and etched as described above in connection with the gate-first method and FIG. 2I.

Referring to FIGS. 3 and 4B, a first spacer layer is deposited and etched to form first sidewall spacers 252 adjacent to the polysilicon gates 250 and the metal gates 242, 244, 246 and 248, of the MOS transistors 210a-c and the NVM transistor 206, and one or more lightly-doped drain extensions (MOS LDD 254) are implanted adjacent to and one or more of the MOS transistors (step 314). The first sidewall spacers 252 and MOS LDD 254 can be formed as described above in connection with the gate-first method and FIG. 2J.

Next referring to FIGS. 3 and 4C, a ONO LDD mask is formed over the substrate 204, lightly-doped drain extensions (ONO LDD 256) are implanted, adjacent to the NVM transistor 206, SONOS pocket or halo implants 258 extending partially into the channel region 224 under the gate stack 228 of the NVM transistor implanted, and a second spacer layer is deposited and etched to form second sidewall spacers 260 adjacent to the first sidewall spacers 252, of the NVM transistor (step 316). The ONO LDD 256 and the sidewall spacers 252 can be formed as described above in connection with the gate-first method and FIG. 2K.

Referring to FIGS. 3 and 4D, source and drain implants are performed to form S/D regions 262 for the NVM transistor 206 and all of the MOS transistors 210a-c, a hard mask formed and patterned to expose only the S/D regions of the PLVFET 210c, a SiGe layer deposited and etched, the hard mask removed to form a strain inducing layer 264 over the S/D regions of the PLVFET, and a silicide process can be performed to form silicide 266 on the exposed S/D regions 262 (step 318). The strain inducing layer 264 and the silicide 266 can be formed as described above in connection with the gate-first method and FIG. 2L.

Next referring to FIGS. 3 and 4E, the method further includes forming a stress inducing structure or layer 268, such as a stress inducing nitride layer, over the MOS transistors 210a-c, depositing an ILD layer 270 over substantially the entire surface of the substrate 204 and all layers and structures formed thereon, and the ILD layer planarized using a CMP process to expose the dummy polysilicon gates 250 and the dummy polysilicon gates removed (step 320). The stress inducing structure or layer 268 can be formed as described above in connection with the gate-first method and FIGS. 2M and 2N. The dummy polysilicon gates 250 can be etched or removed using standard polysilicon etch chemistries, such as described above, which are highly selective to the material of the ILD layer 270, the first and second spacers 252, 260, the ONO layers 226 and the gate oxides 236 and 238.

Referring to FIGS. 3 and 4F, a high-k dielectric material 240 is formed or deposited on or over the ONO layers 226 and the gate oxides 236 and 238 exposed by the removal of the dummy polysilicon gates 250 to concurrently form a multilayer blocking dielectric 234 including the high-k dielectric material in the gate stack 228 of the NVM transistor and multilayer gate dielectrics including the gate oxides 236, 238, and the high-k dielectric material in the MOS regions (step 322). The high-k dielectric material 240 may include, but is not limited to, hafnium oxide, zirconium oxide, hafnium silicate, hafnium oxy-nitride, hafnium zirconium oxide and lanthanum oxide deposited to a physical thickness between about 3.0 nm and about 8.0 nm by, for example, physical vapor deposition (PVD), atomic layer deposition (ALD), a chemical vapor deposition (CVD), a low pressure CVD (LPCVD) or a plasma enhanced CVD (PECVD) process.

Figure 4G:
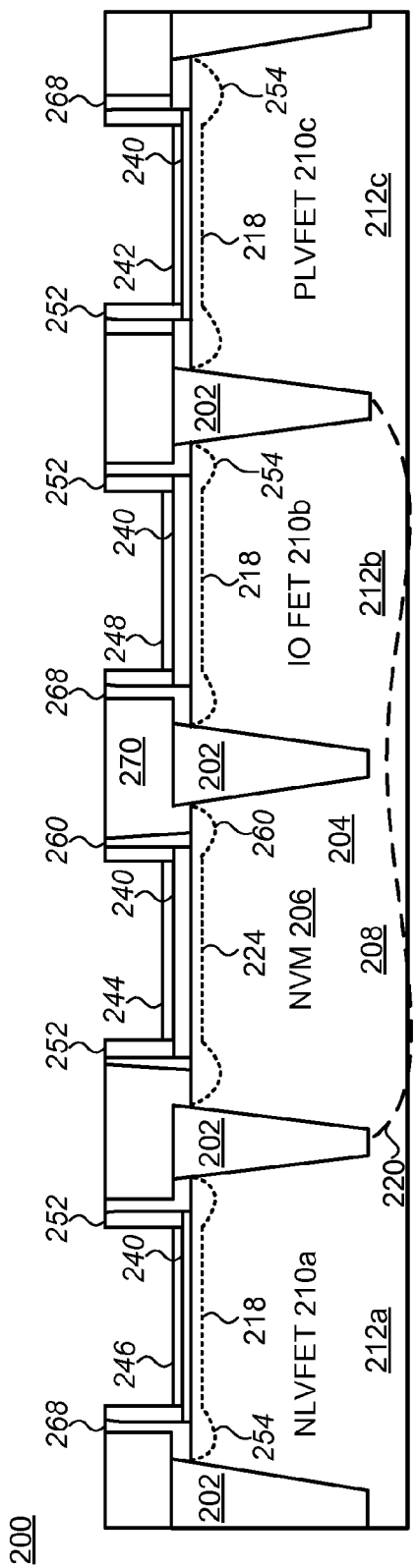

Referring to FIGS. 3 and 4G, first metal layers of multi-layer metal gates are formed for the MOS transistors 210a-210c, and, optionally, for the NVM transistor 206 (step 324). In one embodiment, a first or P+ metal layer (high work function) is deposited over substantially the entire surface of the substrate 204 and all layers and structures formed thereon, a patterned photoresist mask (not shown) formed using standard lithographic techniques and the P+ metal layer etched to stop on surfaces of the high-k dielectric material 240, thereby forming a high work function gate 242 for a P-type low voltage MOS transistor (PLVFET 210c) and a optionally a high work function gate 244 for the NVM transistor 206. Next, a second or N+ metal layer (low work function) is deposited over substantially the entire surface of the substrate 204, including the gate 242 of the PLVFET 210c, a patterned photoresist mask formed and the N+ metal layer etched to form a low work function metal gate 246 for a N-type low voltage MOS transistor (NLVFET 210a), a metal gate 248 for the I/O FET 210b. Optionally, if a high work function gate for the NVM transistor 206 has not been formed from the first or P+ metal layer, a low work function gate 244 may instead be concurrently formed for the NVM transistor 206.

Figure 4H:
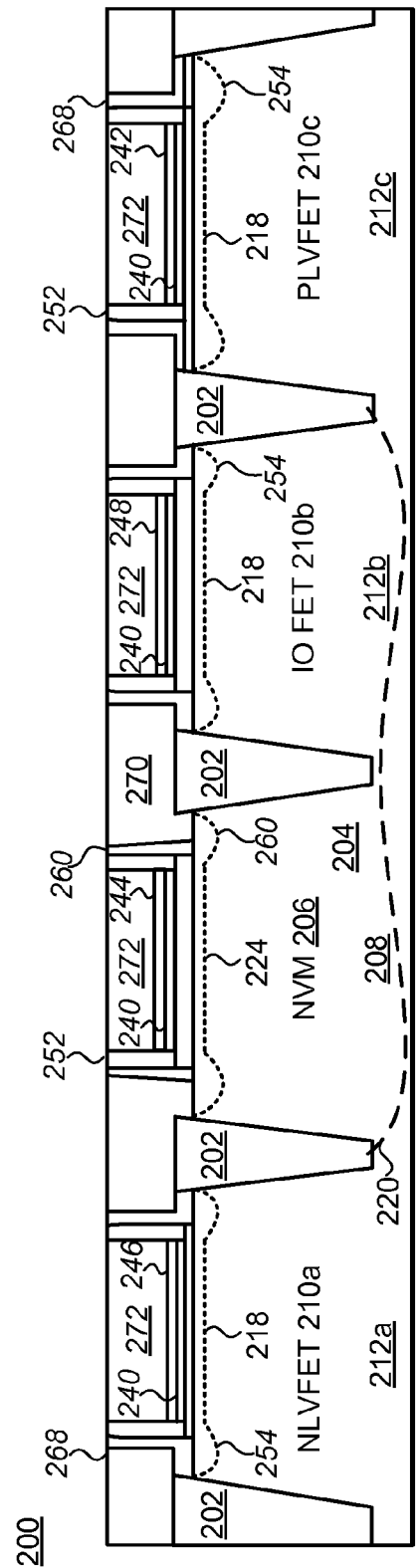
Figure 4I:
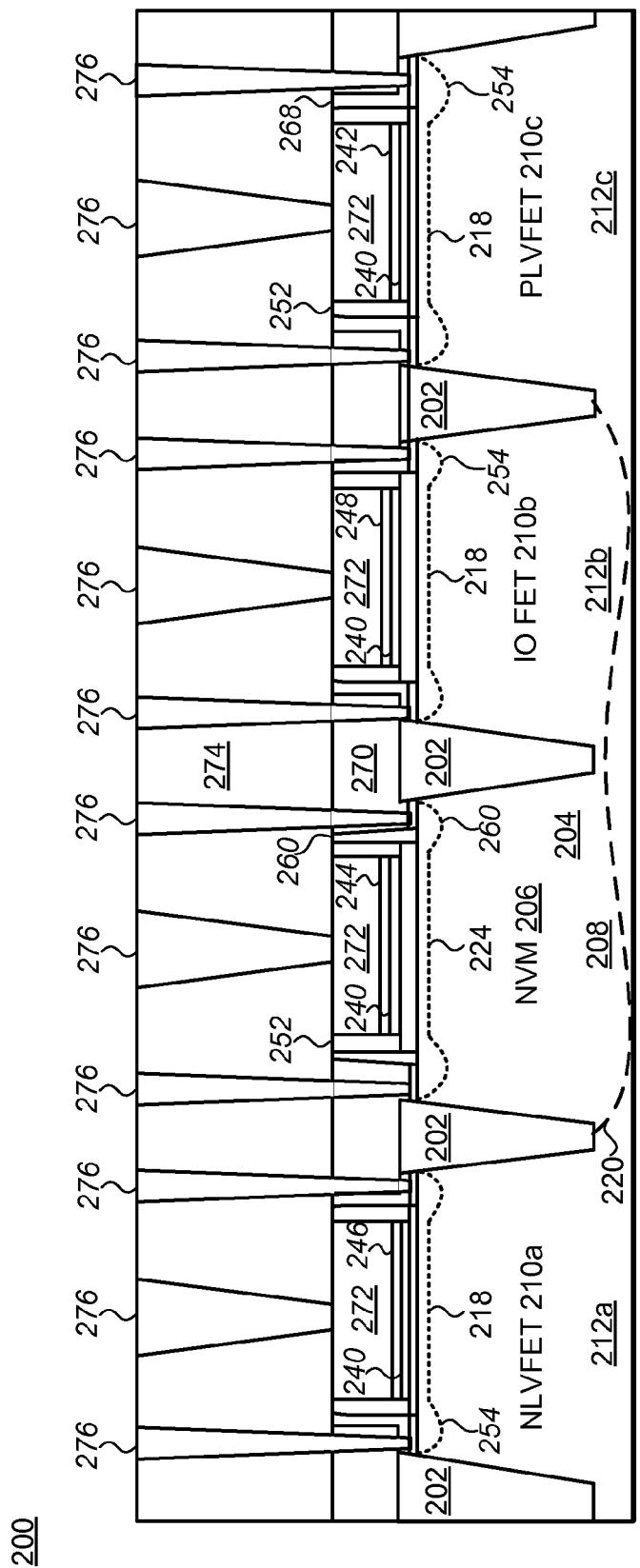

Finally referring to FIG. 3 and FIGS. 4H and 4I, a thick gate metal layer 272 is deposited followed by planarization using a CMP process to form a second metal layer completing the formation of multilayer metal gates for the NVM transistor 206 and all of the MOS transistors 210a-c, a second ILD layer 274 deposited and contacts 276 formed to the S/D regions and gates for the NVM transistor and all of the MOS transistors (step 326). The thick metal layer 272 can include a conformal layer of Aluminum, titanium, titanium-nitride, tungsten or compounds or alloys thereof, deposited to a thickness of from about 0.1 µm to about 0.5 µm, using physical or chemical vapor deposition. The second ILD layer 274 can include, for example, silicon oxide, deposited or grown to a thickness of from about 0.5 µm to about 1 µm, using any known CVD as described above. The contacts 276 can be formed by forming a patterned PR mask over the second ILD layer 274, etching the second ILD layer using any of the standard oxide etch processes as described above to stop on the silicide 266. The contacts 276 can be formed as described above in connection with the gate first method and FIG. 2N.

Figure 5:
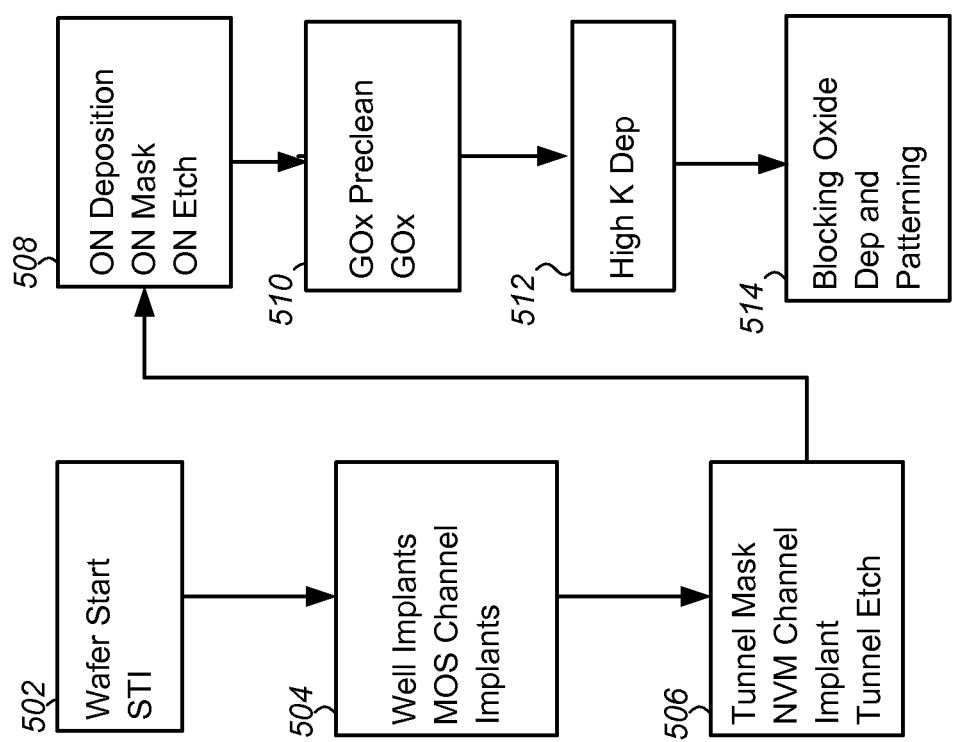
FIG. 5 is a flowchart illustrating an yet another embodiment of a method for fabricating a memory cell including a NVM transistor and MOS transistors including a high-k dielectric in a trapping layer.

Another embodiment of a method for integrating or embedding a NVM transistor into a high-k, metal gate CMOS process flow will now be described in detail with reference to FIG. 5 and FIGS. 6A through 6F. FIG. 5 is a flowchart illustrating an embodiment of a method or process flow in which the high-k dielectric material 240 is incorporated into the charge trapping. FIGS. 6A-6F are block diagrams illustrating cross-sectional views of a portion of a memory cell 200, including a NVM transistor and MOS transistors, during fabrication of the memory cell according to the method of FIG. 5.

Referring to FIG. 5, as with the gate-first method described above the process begins with forming a number of isolation structures 202 in a wafer or substrate 204 (step 502). Next, dopants are then implanted into substrate 204 through the pad oxide 214 to concurrently form wells in the NVM region 208 and one or more of the MOS regions 212a-c, and to form channels 218 for MOS transistors that will be formed in the MOS regions (step 504). A patterned tunnel mask 222 is formed on or overlying the MOS regions 212a-c, and dopants of an appropriate, energy and concentration are implanted through a window or opening in the tunnel mask to form a channel 224 for a NVM transistor 206, and the tunnel mask and the pad oxide in at least the NVM region 208 removed (step 506). At this point the memory cell 200 is substantially identical to that described above and shown in FIG. 2C.

Next referring to FIG. 5 and FIGS. 6A and 6B, a number of dielectric or oxide and oxynitride or nitride layers, shown collectively as ON layers 278, are formed or deposited the surface 216 of the substrate 204, a mask formed on or overlying the ON layers, and the ON layers etched to form a gate stack 280 of the NVM transistor 206 in the NVM region 208 (step 508). It will be understood that up to this point the memory cell 200 shown in FIGS. 6A and 6B differ from that of the embodiments of FIGS. 2D and 2E in that the gate stack 280 of the NVM transistor 206 does not include the blocking dielectric 234. It will be further understood that as with embodiments described above, the tunnel dielectric 230 and the charge-trapping layer 232 may include one or more layers of material. In particular, the charge-trapping layer 232 may be or include a multilayer charge-trapping layer including at least an oxygen-rich, substantially charge trap free lower or first charge-trapping layer 232a closer to the tunnel dielectric 230, and an upper or second charge-trapping layer 232b that is silicon-rich and oxygen-lean relative to the first charge-trapping layer and comprises a majority of a charge traps distributed in multilayer charge-trapping layer.

Next referring to FIGS. 5 and 6C, a gate oxide or GOX preclean is performed, and gate oxides for MOS transistors 210a-210c formed in the MOS regions 212a-c (step 510). Referring to FIG. 2F, in some embodiments, such as that shown, the oxidation process is a dual gate oxidation process to enable fabrication of both a first, thick gate oxide 236 over the surface 216 of the substrate 204 in one MOS region 212b for a HV transistor, such as I/O FET 210b, and second thinner gate oxides 238 LV transistors 216, such as NLVFET 210a and PLVFET 210c, in the remaining MOS regions 212a and 212c. The thick gate oxide 236 and thin gate oxides 238 can be formed as described above in connection with the gate-first method and FIG. 2F.

Next referring to FIG. 5 and FIGS. 6D and 6E, a high dielectric constant or high-k dielectric material 240 is formed or deposited on or over the gate stack 280 of the NVM transistor 206, in the NVM region 208 and in the MOS regions 212a-c to concurrently form a multilayer charge-trapping layer 232 including the high-k dielectric material and multilayer gate dielectrics including the gate oxides 236, 238, and the high-k dielectric material in the MOS regions (step 512). The high-k dielectric material 240 can include any of the high-k materials described above in connection with the gate-first method and FIG. 2G, and can be deposited by CVD or ALD.

In one embodiment, such as that shown in FIG. 6E, the multilayer charge-trapping layer 232 can include an oxygen-rich, substantially charge trap free lower or first charge-trapping layer 232a closer to the tunnel dielectric 230, a trap rich, silicon-rich and oxygen-lean upper or second charge-trapping layer 232b, and the high-k dielectric material 240. It will be appreciated that in some versions of this embodiment the high K layer can also act as an additional charge trapping layer.

Referring to FIGS. 5 and 6F, a blocking dielectric 234 is formed on or overlying the high-k dielectric material 240 and patterned (step 514). In one embodiment, the blocking dielectric 234 can include a silicon oxide ($SiO_2$) or a silicon oxynitride (SiON), formed by CVD performed in a batch or single substrate processing chamber with or without an ignition event such as plasma. The blocking dielectric 234 can be a single layer of silicon oxide, having a substantially homogeneous composition, or a single layer of silicon oxynitride having a gradient in stoichiometric composition. Using a photoresist mask and etch, the layer 234 can be removed from the MOS regions 212a-c.

Finally, the process can be continued with either the gate-first process flow illustrated and described above with respect to FIG. 1, or the either the gate-last process flow illustrated and described above with respect to FIG. 3. That is the gate-first process flow can be followed beginning with the forming of metal gates of the MOS transistors 210a-c, and optionally for the NVM transistor 206 in step 114 and continuing through step 128. Similarly in an alternative embodiment is the gate-last process flow can be followed beginning with deposition of a polysilicon layer and forming of dummy polysilicon gates 250 for the MOS transistors 210a-c, and optionally for the NVM transistor 206 in step 312 and continuing through step 326.

Figure 7:
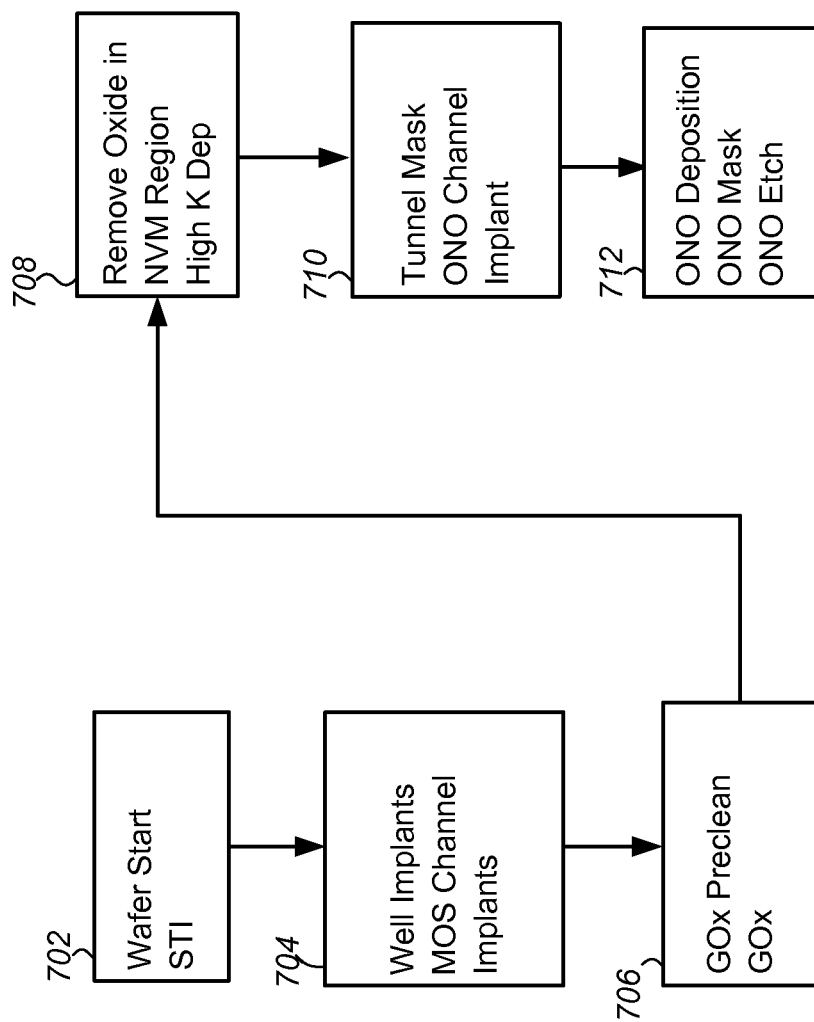
FIG. 7 is a flowchart illustrating an yet another embodiment of a method for fabricating a memory cell including a NVM transistor and MOS transistors including a high-k dielectric in a tunnel dielectric.

Another embodiment of a method for integrating or embedding a NVM transistor into a high-k, metal gate CMOS process flow will now be described in detail with reference to FIG. 7 and FIGS. 8A through 8E. FIG. 7 is a flowchart illustrating an embodiment of a method or process flow in which the high-k dielectric material 240 is incorporated into the tunnel dielectric 230. FIGS. 8A-8E are block diagrams illustrating cross-sectional views of a portion of a memory cell 200, including a NVM transistor and MOS transistors, during fabrication of the memory cell according to the method of FIG. 7.

Referring to FIG. 7, as with the methods or process flows described above the process begins with forming a number of isolation structures 202 in a wafer or substrate 204 (step 702), and implanting dopants into substrate 204 through the pad oxide 214 to concurrently form wells in the NVM region 208 and one or more of the MOS regions 212*a-c*, and to form channels 218 for MOS transistors that will be formed in the MOS regions (step 704). At this point the memory cell 200 is substantially identical to that shown in FIG. 2B and described above.

Next referring to FIG. 7 and FIG. 8A, a gate oxide or GOX preclean is performed, and gate oxides for MOS transistors 210*a*-210*c* formed in the MOS regions 212*a-c* (step 706). In some embodiments, such as that shown in FIG. 8A, the oxidation process is a dual gate oxidation process to enable fabrication of both a first, thick gate oxide 236 over the surface 216 of the substrate 204 in one MOS region 212*b* for a HV transistor, such as I/O FET 210*b*, and second thinner gate oxides 238 LV transistors 216, such as NLVFET 210*a* and PLVFET 210*c*, in the remaining MOS regions 212*a* and 212*c*. The thick gate oxide 236 and thin gate oxides 238 can be formed as described above in connection with the gate-first method and FIG. 2F.

Referring to FIG. 7 and FIG. 8B, using a photoresist mask and a BOE etch any gate oxide formed in the NVM region 208 is removed to expose the surface 216 in this region, and a high dielectric constant or high-k dielectric material 240 is formed or deposited on or over the NVM region 208 and in the MOS regions 212*a-c* to concurrently form a high-k tunnel dielectric 282 and multilayer gate dielectrics in the MOS regions including the gate oxides 236, 238, and the high-k dielectric material 240 (step 708). The high-k dielectric material 240 can include any of the high-k materials described above in connection with the gate-first method and FIG. 2G, and can be deposited by CVD or ALD. It is noted that the embodiment of FIG. 8B differs from those shown and described above in that the high-k tunnel dielectric 282 is formed directly on the surface 216 of the substrate 204 in the NVM region 208, prior to or in place of forming a tunnel dielectric 230 including a silicon oxide, or silicon-oxynitride. It will be understood however that in an alternative embodiment (not shown) the high-k tunnel dielectric 282 can be part of a multilayer tunnel dielectric, formed over a silicon oxide, or silicon-oxynitride formed or grown in the NVM region 208 during or following gate oxidation process.

Next referring to FIG. 7 and FIG. 8C, a patterned tunnel mask 222 is formed on or overlying the MOS regions 212*a-c*, and dopants of an appropriate, energy and concentration are implanted through a window or opening in the tunnel mask to form a channel 224 for a NVM transistor 206 (step 710).

Referring to FIG. 7 and FIGS. 8D and 8E, the tunnel mask removed and a number of dielectric or nitride-oxide (NO) layers, shown collectively as NO layers 284, are formed or deposited the surface 216 of the substrate 204, a mask formed on or overlying the ONO layers, and the ONO layers etched to form a gate stack 286 of a NVM transistor 206 in the NVM region 208 (step 712). As with embodiments described above, the charge-trapping layer 232 and the blocking dielectric 234 may include one or more layers of material. In particular, the charge-trapping layer 232 may be or include a multilayer charge-trapping layer including at least an oxygen-rich, substantially charge trap free lower or first charge-trapping layer 232*a* closer to the high-k tunnel dielectric 282, and an upper or second charge-trapping layer 232*b* that is silicon-rich and oxygen-lean relative to the first charge-trapping layer and comprises a majority of the charge traps distributed in multilayer charge-trapping layer.

Finally, the process can be continued with either the gate-first process flow illustrated and described above with respect to FIG. 1, or the either the gate-last process flow illustrated and described above with respect to FIG. 3. That is the gate-first process flow can be followed beginning with the forming of metal gates of the MOS transistors 210*a-c*, and optionally for the NVM transistor 206, in step 114 and continuing through step 128. Similarly in the alternative embodiment the gate-last process flow can be followed beginning with deposition of a polysilicon layer and forming of dummy polysilicon gates 250 for the MOS transistors 210*a-c*, and optionally for the NVM transistor 206 in step 312 and continuing through step 326.

Thus, embodiments of methods for fabricating memory cells including embedded or integrally formed ONO based NVM transistor and MOS transistors with high-k gate dielectrics and/or high work function metal gates have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:
1. A memory cell comprising:
   a substrate including a non-volatile memory (NVM) region and a plurality of metal-oxide-semiconductor (MOS) regions;
   a silicon-oxide-nitride-oxide-semiconductor (SONOS) transistor in the NVM region, the SONOS transistor including a tunnel dielectric on the substrate, a charge-trapping layer on the tunnel dielectric, and a blocking dielectric comprising a high-k dielectric material over the charge-trapping layer;

MOS transistors in the plurality of MOS regions, each of the MOS transistors including a gate dielectric comprising a high-k dielectric material over a surface of the substrate; and multilayer metal-polysilicon gates over the high-k dielectric material of the SONOS transistor, and the gate dielectrics of MOS transistors, the multilayer metal-polysilicon gate over the SONOS transistor comprising a low work function multilayer metal-polysilicon gate of the SONOS transistor, and the multilayer metal-polysilicon over the MOS transistor comprising a low work function multilayer metal-polysilicon gate of at least one MOS transistor, and a high work function multilayer metal-polysilicon gate of another MOS transistor.

2. The memory cell of claim 1 wherein the blocking dielectric and the gate dielectric comprise the same high-k dielectric material.

3. The memory cell of claim 1 wherein the blocking dielectric is a multilayer blocking dielectric further comprising a high-temperature-oxide (HTO) between the high-k dielectric material and the charge-trapping layer of the SONOS transistor.

4. The memory cell of claim 1 wherein the charge-trapping layer is a multilayer charge-trapping layer comprising an oxygen-rich, first charge-trapping layer on the tunnel dielectric, and a second charge-trapping layer that is silicon-rich and oxygen-lean relative to the first charge-trapping layer and comprises a majority of a charge traps in the multilayer charge-trapping layer.

5. The memory cell of claim 1 wherein the tunnel dielectric is a multilayer tunnel dielectric including a bottom layer on the substrate comprising silicon dioxide or silicon oxynitride, and a top layer over the bottom layer comprising high-k dielectric material.

6. The memory cell of claim 1 further comprising a high-temperature-oxide (HTO) between the high-k dielectric material of the gate dielectric and the surface of the substrate to form a thick gate oxide of an input/output field effect transistor (I/O FET).

7. A memory cell comprising:
a substrate including a non-volatile memory (NVM) region and a plurality of complimentary-metal-oxide-semiconductor (CMOS) regions;
a silicon-oxide-nitride-oxide-semiconductor (SONOS) transistor in the NVM region, the SONOS transistor including a tunnel dielectric on the substrate, a charge-trapping layer on the tunnel dielectric, a blocking dielectric comprising a high-k dielectric material over the charge-trapping layer, and a multilayer metal-polysilicon gate over the high-k dielectric material; and
a plurality of MOS transistors in the plurality of CMOS regions comprising a high-k dielectric material over a surface of the substrate and multilayer metal-polysilicon gates over the high-k dielectric material, at least one of the MOS transistors including a multilayer metal-polysilicon gate comprising a N+ metal layer to form a low work function multilayer metal-polysilicon gate, and another MOS transistor including a multilayer metal-polysilicon gate comprising a P+ metal layer to form a high work function multilayer metal-polysilicon gate.

8. The memory cell of claim 7, wherein the multilayer metal-polysilicon gate over the SONOS transistor comprises a P+ metal layer to form a high work function multilayer metal-polysilicon gate.

9. The memory cell of claim 7, wherein the multilayer metal-polysilicon gate over the SONOS transistor comprises a N+ metal layer to form a low work function multilayer metal-polysilicon gate.

10. The memory cell of claim 7, wherein the MOS transistor including the high work function multilayer metal-polysilicon gate comprises an input/output field effect transistor (I/O FET).

11. The memory cell of claim 7, wherein the MOS transistor including the low work function multilayer metal-polysilicon gate comprises a low voltage field effect transistor (LVFET).

* * * * *